(12) United States Patent
Kenney et al.

(10) Patent No.: US 6,311,004 B1
(45) Date of Patent: Oct. 30, 2001

(54) PHOTONIC DEVICES COMPRISING THERMO-OPTIC POLYMER

(75) Inventors: John T. Kenney, Palo Alto; John Midgley, San Carlos; Valentine N. Morozov, San Jose; Ken Purchase, Mountain View; Marc Stiller, Boulder Creek; Anthony Ticknor, Cupertino, all of CA (US); James Burke, Tucson, AZ (US); John Love, Flynn (AU)

(73) Assignee: Lightwave Microsystems, San Jose, CA (US)

( * ) Notice: Subject to any disclaimer, the term of this patent is extended or adjusted under 35 U.S.C. 154(b) by 0 days.

(21) Appl. No.: 09/437,690

(22) Filed: Nov. 10, 1999

Related U.S. Application Data

(60) Provisional application No. 60/107,823, filed on Nov. 10, 1998.

(51) Int. Cl.[7] ..................................... G02B 6/10
(52) U.S. Cl. ............................................ 385/130
(58) Field of Search .................. 385/14, 49, 50, 385/65, 83, 130–133, 129; 359/344; 438/29, 23, 109, 25, 27, 67, 65, 31; 72/46, 50, 14

(56) References Cited

U.S. PATENT DOCUMENTS

| 3,580,656 | 5/1971 | Carson . |
|---|---|---|
| 4,070,092 | 1/1978 | Burns . |
| 4,708,423 | 11/1987 | Erman et al. . |
| 4,840,446 | 6/1989 | Nakamura et al. . |
| 4,895,615 | 1/1990 | Muschke . |

(List continued on next page.)

FOREIGN PATENT DOCUMENTS

| 0445527 | 9/1991 | (EP) . |
|---|---|---|
| 0621504 | 10/1994 | (EP) . |
| 0 981 064 | 2/2000 | (EP) . |
| 2199157 | 6/1988 | (GB) . |
| 62-119504 | 5/1987 | (JP) . |

(List continued on next page.)

OTHER PUBLICATIONS

Anonymous (1992). "Optical Signal Distribution by Filled–Trench Channel Polymer Waveguide" *IBM Technical Disclosure Bulletin* 34(9):411–412.

Chen et al. (1995). "Facile approach to nonlinear optical side–chain aromatic polyimides with large second–order nonlinearity and thermal stability" *J. Am. Chem. Soc.* 117(27):7295–7296.

Cloonan (1994). "Application of free–space photonic technology for ATM switching" *IEEE lasers and electro–optics society meeting* pp. 228–229.

Cloonan (1995). "Promises and challenges for free–space digital optics in switching systems beyond the year 2000" *SPIE* 2400:2–7.

DeVoe et al. (1994). "Precision measurement of the lifetime of a single trapped ion with a nonlinear electro–optic switch" *Optics Letters* 19(22):1891–1893.

(List continued on next page.)

*Primary Examiner*—Akm E. Ullah
(74) *Attorney, Agent, or Firm*—Morrison & Foerster, LLP

(57) ABSTRACT

Hybrid integrated planar photonics provides silica waveguides for transport and polymer or hybrid silica/polymer waveguides for refractive-based active functions within a single integrated photonic circuit. Functions include modulation, attenuation, switching, filtering, and exceptionally low-loss transport. When the active and passive optical elements are integrated onto the same substrates, the resulting composite devices can exhibit strong functional response with little total optical loss as compared to known methods.

20 Claims, 14 Drawing Sheets

U.S. PATENT DOCUMENTS

| | | |
|---|---|---|
| 5,008,043 | 4/1991 | Robello et al. . |
| 5,133,037 | 7/1992 | Yoon et al. . |
| 5,157,756 | 10/1992 | Nishimoto . |
| 5,206,925 | 4/1993 | Nakazawa et al. . |
| 5,281,305 | 1/1994 | Lee et al. . |
| 5,387,269 | 2/1995 | Nijander et al. . |
| 5,395,556 | 3/1995 | Drost et al. . |
| 5,465,310 | 11/1995 | Kersten et al. . |
| 5,465,860 | 11/1995 | Fujimoto et al. . |
| 5,497,445 | 3/1996 | Imoto . |
| 5,514,799 | 5/1996 | Varanasi et al. . |
| 5,553,151 | 9/1996 | Goldberg . |
| 5,581,642 | 12/1996 | Deacon et al. . |
| 5,678,935 | 10/1997 | Sakata . |
| 5,698,452 * | 12/1997 | Goossen ................................. 438/23 |
| 5,703,989 | 12/1997 | Khan et al. . |
| 5,795,768 * | 8/1998 | Mersali et al. ........................ 372/45 |
| 5,857,039 | 1/1999 | Bosc et al. . |
| 5,970,186 | 10/1999 | Kenney et al. . |
| 6,022,671 | 2/2000 | Binkley et al. . |
| 6,025,207 * | 2/2000 | Mersali et al. ........................ 438/20 |
| 6,151,430 * | 11/2000 | Traver et al. .......................... 385/49 |

FOREIGN PATENT DOCUMENTS

| | | |
|---|---|---|
| 63-44604 | 2/1988 | (JP) . |
| 1-248107 | 10/1989 | (JP) . |
| 3-296003 | 12/1991 | (JP) . |
| 5-224245 | 9/1993 | (JP) . |
| 6-214275 | 8/1994 | (JP) . |
| 9-022035 | 1/1997 | (JP) . |
| 90/09605 | 8/1990 | (WO) . |
| WO 98/40771 | 9/1998 | (WO) . |
| WO 98/40783 | 9/1998 | (WO) . |

OTHER PUBLICATIONS

Erman et al. (1994). "Semiconductor digital optical switches and arrays" *OFC '94: Summaries of papers presented at the Conference on Optical Fiber Communication* 4:53.

Falk et al. (1995). "Electro–optic imagery of high–voltage GaAs photoconductive switches" *IEEE transactions on electron devices* 42(1):43–49.

Ferstl (1995). "Fresnel zone lenses for an electro–optical 2×2–switch" *SPIE* 2404:277–285.

Gao et al. (1995). "$Si_{1-x}GE_x$/Si asymmetric 2×2 electro–optical switch of total internal reflection type" *Appl. Phys. Lett.* 67(23):3379–3380.

Heidrich, P.F. and White, J.M. (1976). "Electronically Variable Tap for Multimode Planar Ribbon Optical Waveguides" *IBM Technical Disclosure Bulletin* 18(9):3132–3133.

Hikita, M. et al. (1993). "Optical intensity modulation in a vertically stacked coupler incorporating electro–optic polymer" *Applied Physics Letters* 63(9):1161–1163.

Ivanov et al. (1994). "Modeling of low–intensity electro–optical semiconductor switching device due to intrinic photoconductivity" *J. Appl. Phys.* 76(4):2522–2528.

Lytel et al. (1992). "Large–scale integration of electro–optic polymer waveguides" *Polymers for lightwave and integrated optics*, Chapter 16, Marcel Dekker, Inc., pp. 433–472.

Mori, H. (1978). "Ridge wavguide without high refractive index layer: Multilayer side cladded ridge waveguide" *Applied Optics* 17(1):105–108.

Morrison et al. (1995). "Diode–pumped, Q–switched, $1.321 \mu m$ Nd:YLF laser and its frequency doubling" *Optics Communications* 118:55–60.

Nelson et al. (1994). "Large–angle $13.-\mu m$ InP/InGaAsP digital optical switches with extinction ratios exceeding 20 dB" *OFC '94: Summaries of papers pesented at the Conference on Optical Fiber Communication* 4:53.

Nishihara et al. (1985). *Optical Integrated Circuits* McGraw–Hill, pp. 29–32, 46–61 (Cover page and table of contents enclosed herewith).

Oh–e et al. (1995). "Electro–optical characteristics and switching behavior of the in–plane switching mode" *Appl. Phys. Lett.* 67(26):3895–3897.

Ramey, D.A. and Boyd, J.T. (1979). "Polyurethane Fan–Out Channel Waveguide Array for High Resolution Optical Waveguide Imaging" *IEEE Trans. Circuits and Systems CAS* 26(12):1041–1048.

Ruberto, M.N. et al. (1990). "Graded–Effective–Index Waveguide Structures Fabricated with Laser Processing" *Digital Optical Computing II, SPIE* 1215:538–557.

Shiqing et al. (1995). "Generation of 2~10 ns XeCl laser pulses by direct wave clipping with an electro–optical Q–switching" *Chinese J. Lasers* A22(9):675–680 (English Abstract on p. 680).

Silberberg et al. (1987). "Digital optical switch" *Appl. Phys. Lett.* 51(16):1230–1232.

Streifer et al (1987). "Reformulation of the coupled–mode theory of multiwaveguide systems" *J. Lightwave Technology* LT5(1):1–4.

Zayhowski et al. (1995). "Coupled–cavity electro–optically Q–switched $Nd:YVO_4$ microchip lasers" *Optics Letters* 20(7):716–718.

* cited by examiner (Known Device)

(Known Device)

(Known Device)

(Known Device)

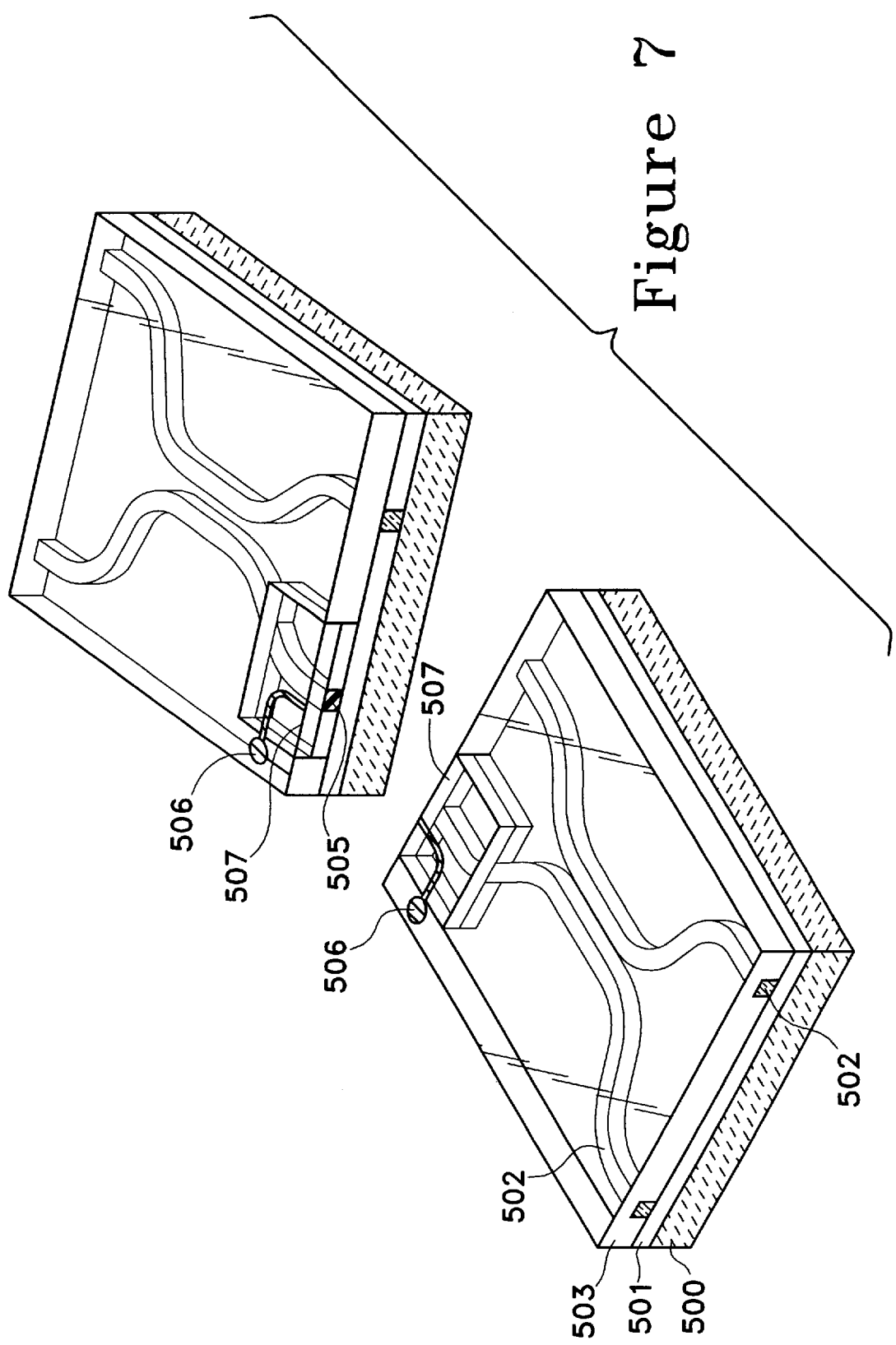

PHOTONIC DEVICES COMPRISING THERMO-OPTIC POLYMER

CROSS-REFERENCE TO RELATED APPLICATIONS

This application claims the benefit of priority to U.S. provisional application Ser. No. 60/107,823, filed Nov. 10, 1998, which provisional application is incorporated by reference in its entirety herein as if fully put forth below.

TECHNICAL FIELD

The invention provides integrated photonic devices for use in fiberoptic communications networks as well as other applications that require optical data signals either to be transported from one location to the next or modified prior to their use by other photonic devices.

BACKGROUND AND SUMMARY OF THE INVENTION

Photonic devices for optical network management and wavelength multiplexing and demultiplexing applications have been extensively researched for a number of years. A significant class of such devices is commonly called "planar lightwave circuits" or "planar lightwave chips" or just PLC's. PLC's comprise technologies wherein complex optical components and networks are disposed monolithically within a stack or stacks of optical thin films supported by a common mechanical substrate such as a semiconductor or glass wafer. PLC's are designed to provide specific transport or routing functions for use within fiberoptic communications networks. These networks are distributed over a multitude of geographically dispersed terminations and commonly include transport between terminations via single-mode optical fiber. For a device in such a network to provide transparent management of the optical signals it must maintain the single-mode nature of the optical signal. As such, the PLC's are commonly, though not strictly, based on configurations of single-mode waveguides. Since optical signals do not require return paths, these waveguide configurations do not typically conform to the classic definition of "circuits", but due to their physical and functional resemblance to electronic circuits, the waveguide systems are also often referred to as circuits.

A key performance issue in the practical application of PLC's is the efficiency of the circuit in transporting the optical energy of the signal. This performance is characterized in terms of the fraction of energy lost from the signal passing through the device, expressed as "loss" in units of decibels (dB) or "loss rate" in units of dB/cm. The standard family of materials for PLC waveguides, widely demonstrated to have superior loss characteristics, is based on silicon dioxide ($SiO_2$), commonly called silica. The silica stack includes layers that may be pure silica as well as layers that may be doped with other elements such as Boron, Phosphorous, Germanium, or other elements or materials. The doping is done to control index-of-refraction and other necessary physical properties of the layers. Silica, including doped silica, as well as a few less commonly used oxides of other elements, are commonly also referred to collectively as just "oxides". Furthermore, although technically the term "glass" refers to a state of matter that can be achieved by a broad spectrum of materials, it is common for "glass" to be taken to mean a clear, non crystalline material, typically $SiO_2$ based. It is therefore also common to hear of oxide PLC's being referred to as "glass" waveguides. Subsequently, the moniker "silica" is used to refer to those silicon oxide materials suitable for making PLC waveguides or other integrated photonic devices.

One of the promising features of PLC's is the ability to integrate transport and interconnect functions with dynamically selectable functions such as routing, switching, attenuation, and programmable filtering. These dynamic functions typically are used to provide integrated, solid-state replacements for functions that would otherwise need to be performed by discrete components using mechanical-displacement-based devices. These functions are achieved based on the phenomena that certain stimuli applied to the active area of a waveguide device will change the magnitude of the refractive indices in and around the waveguides in that area. Typically-used stimuli for changing the refractive index are electric field (electro-optic), heat (thermo-optic), or dynamic stress (acousto-optic). Less commonly, other effects such as piezo-optic, static-stress, photo-refractive, etc., are employed. in waveguide applications In the current state-of-the-art, thermo-optics is being accepted for the broadest range of applications and can provide a more predictable response to the randomly varying polarization of the optical signal presented by the telecommunications network. As such, discussions in this application will focus on thermo-optics, where a heat source in the vicinity of the active region of the waveguide device is used to change the temperature and thus select an index change and effect the operation of the device. The optical behavior of these devices is simply determined by the refractive-index distributions generated. It should be recognized that it would be readily apparent to those skilled and experienced in these technologies that the devices and structures described in this teaching can be applied in substance to electro-optic and other methods of stimulating the appropriate refractive-index profiles.

As previously stated, silica waveguides have superior loss characteristics for transporting the optical signals used in these communications networks. Their performance is also very stable with respect to reasonable changes of their local environment. This behavior is desirable for transport and interconnect functions, but it leads to difficulties in achieving any of the stimulated functions. There are a few thermo-optic devices for these applications currently being made from silica waveguides. Since the index changes that can be commanded are on the order of only $10^{-4}$ per micron and can not be localized within regions a few microns wide, thermo-optic silica devices exhibit marginally acceptable performance while requiring uncommonly sophisticated control of the driving conditions.

Other classes of materials, notably optical polymers, have superior response for stimulated functions. They however can not match the low-loss transport qualities of good silica at relevant optical wavelengths. There also are various thermo-optic devices and circuits being made with optical-polymer waveguides and they achieve reasonable and robust levels of performance for their active functions, but the overall device loss is fairly high, typically a few dB for simple functions like a 2×2 switch. Currently, the main impediment to wide-spread deployment of such solid-state switches in fiber-optic telecommunications networks is a lack of availability of robust switches having less than 1 dB of device loss.

When one wishes to make a thermo-optic waveguide switch, it would be expected that the optical signals should be appropriately coupled with high efficiency between the input and output ports in response to the driven stimulus, and that this performance should not be significantly altered by any undriven stimulus. That is, for a thermo-optic switch one would want to simultaneously achieve: (1) the heating signal applied or removed by direction of the user should robustly establish the switching; and (2) any heat applied or removed by conditions arising from the environment should not effect the switching. To exhibit this behavior the device must be shielded from environmental changes and/or the switch must be designed to be sensitive to an applied heating that cannot occur naturally and insensitive to thermal patterns that can occur naturally. The former approach is occasionally used when there is no other way to achieve superior performance, but the latter approach is invariably preferable when available, since stabilization techniques are more expensive to realize and support and typically reduce the reliability of the overall device.

There is a class of devices, commonly referred to as "digital optical switches" that exhibit some very desirable characteristics in regard to the conditions cited above. Firstly, the response of these devices saturates as the driving temperature is increased, so a device may be "over driven" to isolate the response from any changes not arising from the drive signal. Secondly, these devices are typically configured to respond only to a strong thermal index gradient of order $10^{-4}$ per micron or greater. Such gradients are only achieved with highly-localized heating such as can be done with a photolithographically-patterned resistive heater, but can not arise from naturally occurring thermal phenomena or noise. Thirdly, devices of these types can typically be designed with a complimentary symmetry such that activating a heater in one position on the device can saturate the device to one state, while activating a heater at a different position on the device can saturate the response to the complimentary state. This provides even further noise immunity. The archetypal digital-optical switch is the adiabatic Y-Junction (Burns, US04070092, 1978). An existing basic Y-junction switch is depicted in FIG. 1. Passing an appropriate current through either heater will impose a thermal gradient across the junction region and down to the substrate with the higher temperature side of the gradient of course being on the side of the driven heater.

If this device were made in optical polymer, which exhibits a decrease in index with increasing temperature, strong optical coupling will be established between the primary waveguide 101 and the waveguide arm disposed opposite the driven heater. That is, driving heater 111 will select the optical path between waveguides 101 and 104, and conversely, driving heater 112 will select the optical path between waveguides 101 and 103. However, an all-polymer digital optical switch suffers from high photonic loss. Consequently, the use of all-polymer digital optical switches can require a number of optical amplifiers to be included within the optical circuits.

It is not practical to make a digital optical switch in silica. Silica exhibits little change in refractive index with temperature and has a moderately high thermal conductivity. It is consequently very difficult to provide sufficient heat to raise the temperature of the silica sufficiently that switching occurs.

Another configuration of the digital-optical switch is the parabolic directional coupler depicted in FIG. 2 (Syahriar et al., 1998). Here, when the heater is undriven, the thermal properties of the substrate ensure that there is no thermal gradient across the junction, hence no index gradient. The device is stable in the "bar" state where waveguide 201 is strongly coupled with waveguide 204 and waveguide 202 is strongly coupled to waveguide 203. When heater 211 is driven, an index gradient across the coupling region is established and the device saturates to the "cross" state with waveguide 201 strongly coupled to waveguide 203 and waveguide 202 strongly coupled to waveguide 204.

As compared to other materials for waveguides, silica has a rather low thermo-optic coefficient around $2 \times 10^{-5}$ per degree C. where the thermo-optic coefficient is defined as the change in index per incremental change in temperature, typically measured in units of (degree C.)$^{-1}$. Silica also has a moderately high thermal conductivity around 15° C. per Watt-Meter. A large temperature increase is needed to change the refractive index, yet much of the heat applied to the silica is rapidly conveyed away by the silica. It is consequently not practical in silica to create the index gradients needed for digital-optical switch structures. Similar issues are encountered with waveguides made in semiconductor material systems, where the thermo-optic response is an order of magnitude greater, but so is the thermal conductivity, and the steep index gradients needed for digital-optical switches are equally or more difficult to establish with simple heaters. When strong index gradients are not achievable, devices must typically rely on interference. The optical signal is split into two or more optical signals travelling along separate optical paths. The paths must diverge to tens of microns or more separation so thermo-optic refractive-index changes may be applied to one path independently of the other. The signals must then be recombined, and how they are routed through the recombination region will be determined by the relative phases accumulated by the optical signals in each separate path. The resulting device, typically a "Mach-Zehnder"—type interferometer, is depicted in FIG. 3. The response of an interferometer is cyclic and does not saturate with increasing stimulus. They are however very sensitive and can produce a full-scale output swing from an index change of about $5 \times 10^{-5}$ along a 1-cm optical path. Interferometers require extremely precise control of the relative phase accumulation in the optical paths, but they can be especially useful when live feedback is available and acceptable for active control of the drive signal.

In contrast to the inorganic waveguide materials, many optical polymers have a magnitude of the thermo-optic response that is 10–20 times greater (or more) than silica and their thermal conductivity is around $\frac{1}{10}^{th}$ that of silica. Much steeper thermal index gradients can be achieved in optical polymers and digital-optical-switch devices can easily be realized. However, waveguides made in polymers have significantly higher photonic loss rates than good silica waveguides. Consequently, as a rule optical polymers are excellent materials for making small, active photonic structures, but introduce performance penalties in loss when also used as the photonic interconnect between devices and to provide the chip's optical I/O terminations. Conversely, silica an ideal interconnect medium on photonic circuits but makes for poor active devices.

SUMMARY OF DEVICES AND METHODS OF THE INVENTION

This invention provides hybrid active photonic devices for fiberoptic communications networks that are fabricated using silica or similar inorganic dielectric materials for static distribution, transport, interface, and interconnection of the optical system with little photonic loss. Good silica waveguides may exhibit loss rates below 0.01 dB/cm, essentially undetectable on the scale of a typical PLC. In addition to the silica waveguides for interconnect, there will be one or more other material systems selectively disposed within the device to enhance a stimulated response of the optical signal passing through or in the vicinity of the selectively disposed other material. Since this other material facilitates dynamic application of significant refractive-index changes, it is referred to as an active material and enables the realization of waveguide structures for active devices. The active material may be any of or multiple thermo-optic, electro-optic, piezo-optic, photorefractive, and elasto-optic (photoelastic) materials or may be otherwise susceptible to a change in refractive index in response to an applied stimulus. Although well suited to dynamic functions, waveguides in active materials will typically exhibit high propagation losses relative to the inorganic dielectric material in which it is incorporated, having a loss of, e.g., 0.2 to 1.0 dB/cm or higher in wavelength ranges relevant to telecommunications, where the majority of the applications of such devices arise. A typical PLC spans several cm to several-tens of cm of optical path and hence devices made with the entire optical path in polymer have significant optical loss, as is the case for known devices.

In most current PLC's, distribution, transport and interconnect comprise a significant part of the optical path and the fractional optical path-length in the device required for the active optical functions is rather small, often less than 20%. In typical embodiments of this invention, the majority of an integrated photonic device and associated optical path comprises inorganic dielectric material core and cladding (e.g. silica), and a minority of the photonic device comprises at least one region comprised of an active material, e.g. thermo-optic polymer. Within this region, the active material may comprise either the core material or one or more of the cladding materials or any combination or subset thereof. The disposition of active material in these regions is engineered to enable efficient execution of the desired function while introducing minimal collateral loss. The silica has a high thermal conductivity when compared to the thermal conductivity of the polymer, and readily conducts heat away from the interfaces of the heated thermo-optic area. The thermal gradients needed to drive the associated refractive-index changes across the optical path can quickly be established or collapsed within the polymer regions by exercising simple heater structures contacting the polymer or contacting silica topology embedded in the polymer. The heaters can be simple deposited resistive electrodes just as those used in all-silica or all-polymer thermo-optic devices. With the thermo-optic polymer so disposed, desired relationships in the index profile can be thermally stimulated. The thermo-optic polymer is positioned on the device with the minimal incursion required for these index profiles to effect a change in the optical signal and thereby modulate, attenuate, switch, or otherwise provide the intended effect to the intended signal or portion thereof. This leaves the majority of the optical path in low-loss silica.

This invention also provides hybrid-material integrated optical or photonic waveguide devices wherein the differences in the responsive optical coefficients between the active material and the silica is exploited to dynamically control the magnitude of an abrupt change in index along or nearby the optical path. An integrated photonic device comprises a single mechanical substrate supporting multiple regions of optical thin film assemblies (such as filters, attenuators, and modulators) upon the surface of the substrate. At least one of the regions comprises a non-active region such as a passive device (for example, a filter or wavelength division multiplexer formed of inorganic optical compounds exhibiting low optical loss at the optical frequencies of the intended application and exhibiting little or no change in its refractive index under a selected stimulus such as heat). Such inorganic optical compounds include silica, doped silica, and lithium niobate. At least one other of the regions comprises an active region having optical core and cladding, wherein at least a portion of the core and/or cladding is formed of an active material that changes its refractive index with application of the stimulus (e.g. a thermo-optic polymer that exhibits a change in refractive index with a change in the polymer's temperature). Such active materials typically have a much larger change in refractive index to the stimulus than do the passive materials (typically, an active material has at least ten times the change in refractive index that the passive material experiences for a selected level of stimulus) and/or have a much lower thermal conductivity than do the passive materials (typically, an active material has a thermal conductivity at least 10 times lower than the thermal conductivity of an inorganic material such as silica), but the active materials also typically reduce the intensity of the optical signal much more than the passive materials reduce the optical signal's intensity (typically, the loss rate of an active material is on the order of 0.5 to 1 dB/cm, whereas an inorganic optical compound such as silica has a loss rate of less than 0.01 dB/cm). The multiple regions are joined physically and optically such that an optical signal passes efficiently between the regions, being guided by waveguides or other optically transmissive media such as lenses that interconnect the regions with little dissipation of the energy of the optical signal.

One way of exploiting such an index step would be to place a boundary from silica to active material at a shallow angle across a waveguide. This can be utilized such that when the index of the active material is driven substantially lower than that of the silica, an optical signal in the incoming waveguide will be deflected off the boundary and into a waveguide disposed at an angle to the original waveguide. Conversely, when the index of the active material is driven near or above the index of the silica, the optical signal passes through the boundary and continues on in a waveguide along the axis of the original waveguide. A "Total-internal-reflection", or TIR, switch such as the all-polymer TIR switch depicted in FIG. 4, is known. A significant feature of the present invention is that the reflective interface is defined by the physical boundary of the silica and the active material and can be much more abrupt than the field-based boundaries utilized in known TIR switches. This abruptness can be used to produce superior performance in terms of switching efficiency and crosstalk as compared to known embodiments of TIR switches. This switch is discussed in more detail below. Again the active material can be disposed to have the minimum interaction with the optical signal required to perform the function by configuring the reflector and waveguides to take advantage of the active material's large change in refractive index with temperature, so the great majority of the optical path remains silica.

Optical polymers are excellent candidates for active materials and are a particularly rich class of materials for thermo-optic applications. A thermo-optic polymer would be selected in any application to provide the desired change in refractive index and dynamically-configurable index gradient for the temperatures achieved by heating the polymer. Suitable polymeric materials include active optical grades of polysilicone, polyimide, epoxy, urethane, polyolefin, and other polymers or copolymers such as a copolymer of tetrafluoroethylene and a trifluoroethylene having a five-membered ring formed of a hydrocarbyl cyclic ether. Many others polymers and related materials have also been demonstrated as thermo-optic waveguide materials and, for the purposes of this invention, exhibit very similar behaviors.

Among other factors, this invention is based on the technical finding that:
- A hybrid-material integrated photonic device; the majority of which is silica or a similar low-loss inorganic dielectric, and;
- The minority of which is a thermo-optic polymer or other suitable active material consequently having less desirable loss characteristics than the silica;

Can simultaneously:
- Route the optical signal with effective attenuation, modulation, switching, filtering, or other active capability;
- Without requiring a stimulus of large magnitude, and;
- While losing little of the power of the optical signal.

Further, this invention can be used to provide even greater improvements in the modulation, attenuation, switching, and/or amplifying capabilities of waveguide devices when the polymeric material has a larger rate of change of refractive index with the applied stimulus than does the surrounding materials. The use of a thermo-optic polymeric material in the small but critical region of the otherwise low-loss silica provides a waveguide device with little unwanted attenuation of the optical data signal while still supporting the effective active capabilities of thermo-optic polymer systems. Consequently, switch arrays and other structures can be tiled within very short distances, and monolithic switch arrays or other structures fabricated on a single substrate are compact. These and other technical findings and advantages are discussed herein.

BRIEF DESCRIPTION OF THE FIGURES

FIG. 7 illustrates a coupler having a partially substituted region where silica topology from the silica core-layer underlies the polymer to help define the waveguides.

DETAILED DESCRIPTION OF THE PREFERRED EMBODIMENTS

The below-described examples embody certain principles of the invention that are described above and herein, but the examples are not to be interpreted as limiting the scope of the claims to the specific examples described herein. Instead, the claims are to be given their broadest reasonable interpretation in view of the description herein, the prior art, and the knowledge of one of ordinary skill in this field.

Since the processing of silica entails higher temperatures than would likely be withstood by optical polymer that is not specifically cooled during silica processing, all of the silica structures would be made prior to applying the optical polymer structures. This in part dictates the sequence of steps provided by this invention.

Figure 5:
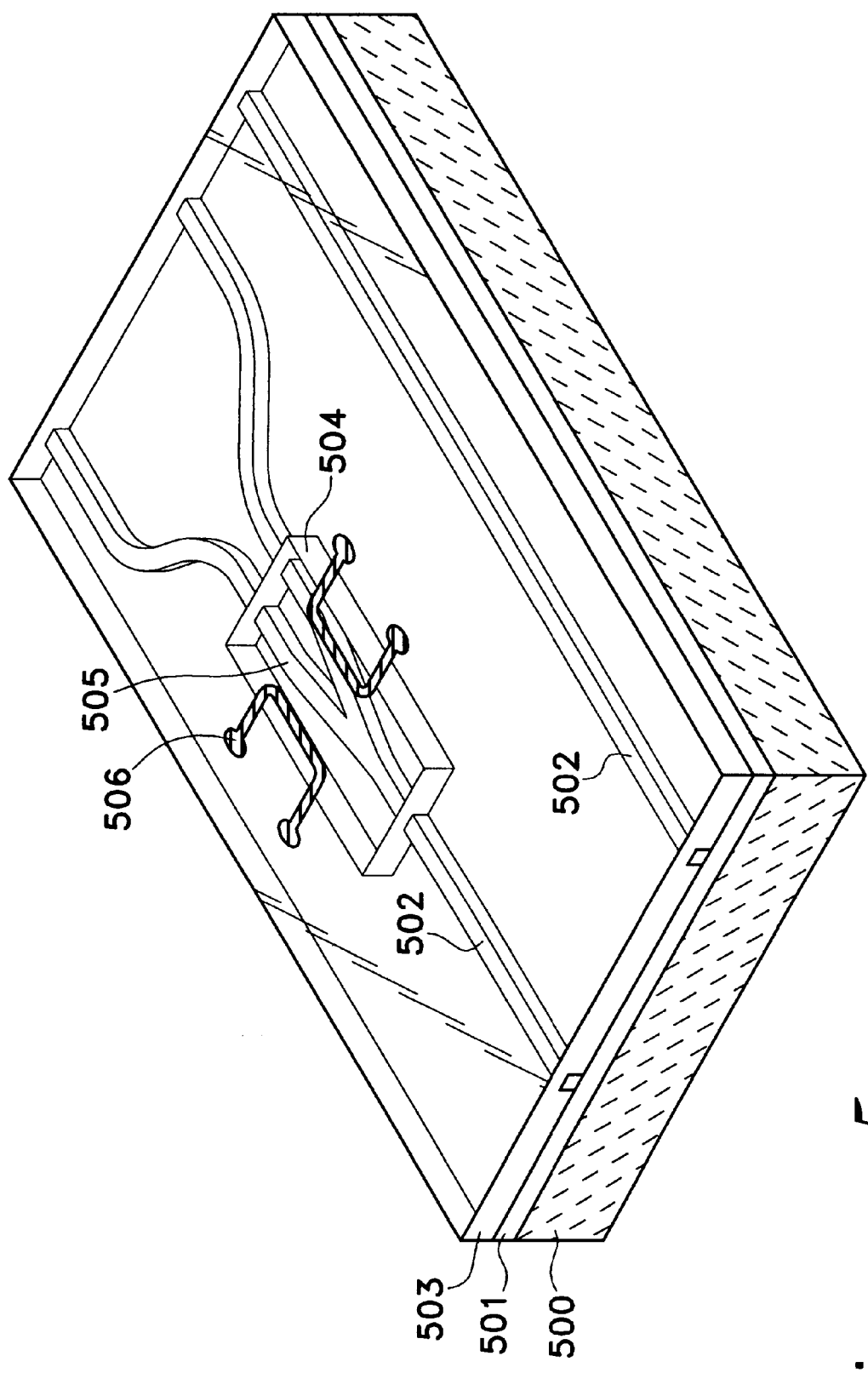
FIG. 5 is an illustration of an adiabatic Y-branch switch within a fully-substituted region where polymer cores with polymer cladding are embedded within the area of a silica waveguide circuit.
Figure 6A:
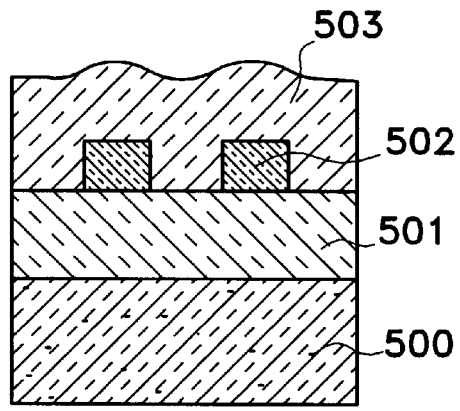
FIGS. 6(a)–(f) are a schematic of a preferred construction method for the fully-substituted embodiment.
Figure 6D:
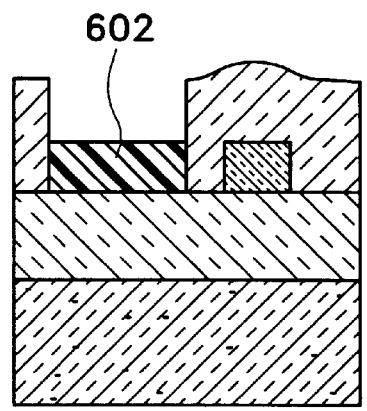
Figure 6B:
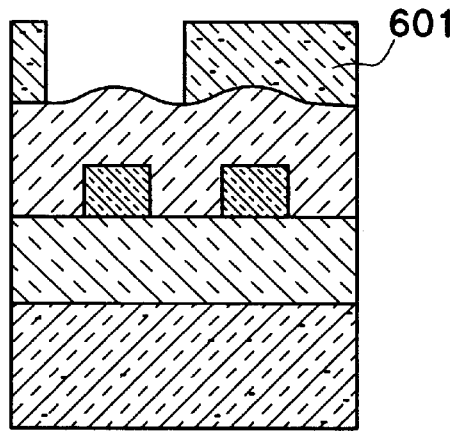
Figure 6E:
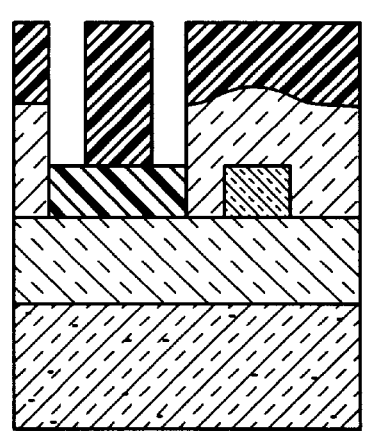
Figure 6C:
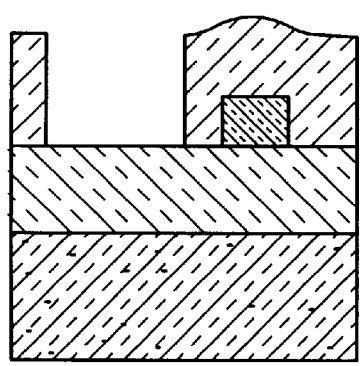
Figure 6F:
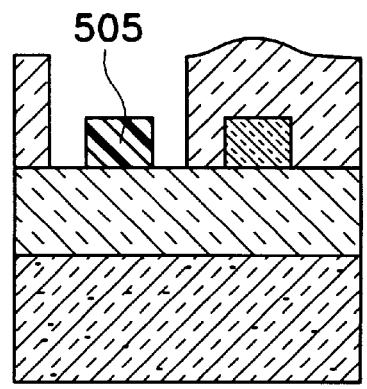
Figure 8A:
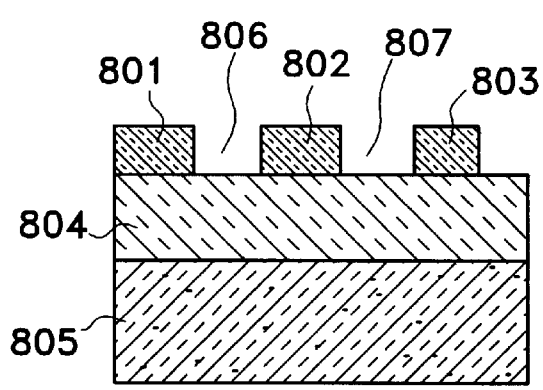
FIGS. 8(a)–(f) show one possible construction schematic for the partially-substituted embodiment of the invention.
Figure 8D:
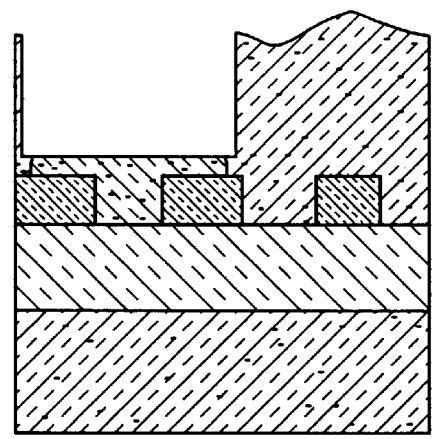
Figure 8B:
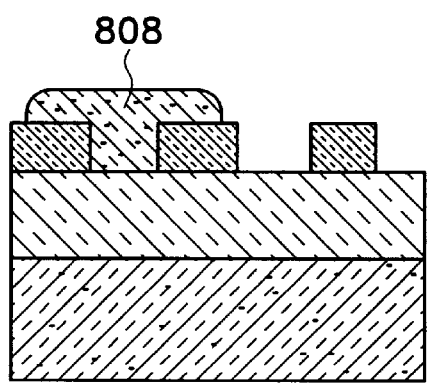
Figure 8E:
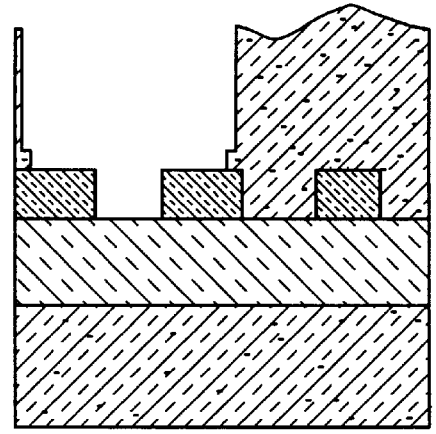
Figure 8C:
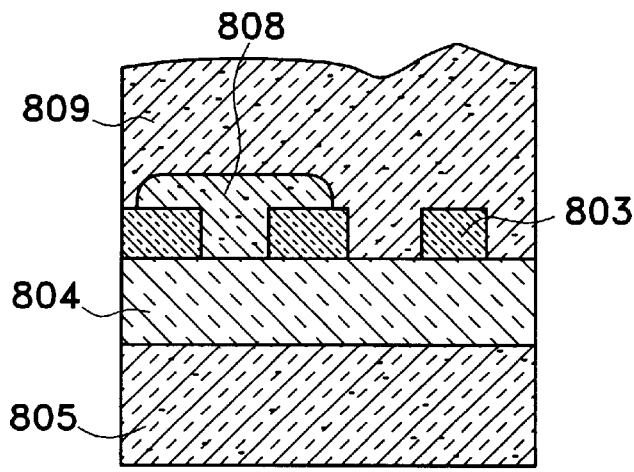
Figure 8F:
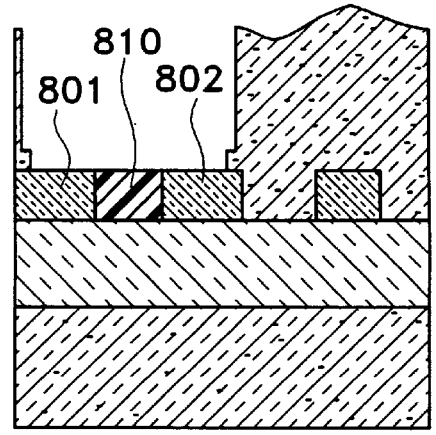

In one embodiment of the present invention, silica waveguides are used to interconnect the optical input/output ports and one or more active optical elements comprising polymer waveguides selectively disposed within the network of silica waveguides. Such a structure is represented in FIG. 5, which illustrates an adiabatic Y-junction switch. The entire assembly (i.e. the switch and waveguides to and from the switch) is supported by a mechanical substrate 500 such as a silicon wafer. A lower optical cladding 501 of suitable thickness to isolate the guided optical field from the silicon lies directly upon the substrate as a uniform film. Silica channel waveguides 502 are formed in the low-loss-core layer and are covered by an upper silica optical cladding 503. Where the active functions are desired, the silica structures are removed, typically to at or just within the upper surface of the lower cladding. Polymer cladding (optionally thermo-optic) is deposited into the created void, and polymer waveguides 505 are fabricated with photolithographic alignment to the silica cores at the interfaces. Heaters 506 for activating the thermo-optic function are fabricated on the upper surface of the upper polymer cladding.

One possible approach for realizing this structure is summarized in FIG. 6. Begin with a silica PLC (a) made by suitable process such as plasma-enhanced chemical vapor deposition (PECVD) with reactive-ion etching (RIE). The silica structures are built in standard fashion to produce a PLC comprising substrate 500, bottom-clad 501, silica waveguide cores 502, and silica coating 503. To follow this invention, an etch-mask 601 on top suitable for enabling 15–20 microns of selected etch depth by (RIE) into the silica is formed on top of the PLC. The etch mask may be for instance a few microns of amorphous silicon. The etch mask is then patterned (b) to expose the PLC regions where the intended active regions are to be formed. The silica is then etched away in the exposed region down to the upper surface of the bottom cladding (c). Core polymer is deposited into the etched region to form a film whose thickness matches the required core thickness (d). This deposition would typically be done with a coating that completely fills the region then applying a timed etch that selectively erodes the polymer surface back to the desired thickness. Next, a photoresist etch-mask is applied and patterned (e) to protect the polymer core pattern and the remaining polymer is etched away to define the polymer waveguide cores 505 (f). Finally, a cladding-polymer overcoat would be applied to fill region 504 of FIG. 5 and provide side and top cladding for the polymer core. Heater electrodes are applied to realize a structure having active region 504 as is depicted in FIG. 5. As can be seen from these descriptions, all of the original silica within active region 504 is replaced from the bottom clad up in this embodiment of the invention. Henceforth in this application, structures and regions of this embodiment will be referred to as "fully-substituted" because both polymeric core and polymeric cladding materials are used to replace inorganic optical materials in a region.

The embodiments of the fully-substituted class are the most versatile of this invention and typically provide the highest active performance.

Another class of embodiments using partial substitution can also be realized when it is important to use less sophisticated processing and when optical polymer can be provided with index-of-refraction within about 0.01 of the silica. When properly configured, a partially substituted embodiment can retain over half the responsiveness of a fully-substituted embodiment and highly effective active devices can be made with streamlined processing. The key for most embodiments of the partially-substituted method is that when the features in the silica core layer are patterned, features are also patterned where the active regions are to be and covered with a protective, sacrificial coating. Later, after the silica processing is completed, the protective coating is exposed and removed to leave the topology of the original features exposed in the active regions. The optical polymer can then be coated over this topology to define the active waveguide devices.

A representative structure with a cross-sectional split is depicted in FIG. 7. Here, a trench aligned with the silica waveguides was formed in the silica core layer under the active region and has been exposed and refilled with a polymer 505 which would have an index slightly greater than the core silica so as to act as a waveguide in the trench. Polymer coating 507 then is applied to provide the upper cladding and electrode heaters 506 are added.

One possible fabrication sequence for this embodiment is sketched in FIG. 8. A core layer on top of cladding silica layer 804 atop silicon substrate 805 is patterned to define the waveguide ribs 801, 802, and 803 for the silica regions of the PLC, it is simultaneously patterned to produce trench 806 within the core silica where the active cores will be (a). The trench of the active region is filled with a sacrificial material 808 that can later be selectively removed, such as amorphous silicon (b). The top silica cladding 809 is then applied to finish the silica process for the PLC, filling trench 807 as well as forming the top cladding (c). A patterned etch is then done over the active areas to expose the sacrificial layer applied to the trenches (d). The sacrificial layer is then selectively removed to expose the original trench (e). If for instance the sacrificial layer is amorphous silicon, it can be selectively removed with a xenon-difluoride chemical etch. The trench is then refilled with core optical polymer 810 and, if necessary, planarized back to the top of the trench (f). From here, top polymeric cladding (active or passive) is coated on and electrodes applied to complete the PLC. The refractive index of polymer 810 is higher than the refractive index of core polymer 801 and 802 so that polymer portions 801 and 802 effectively function as cladding for core 810.

The sacrificial material or temporary filler has physical and chemical properties such as melt point and chemical reactivity that allow other processing such as sputtering or inorganic layer deposition (e.g. silica deposition) to occur, yet are also easily removed using a selective etchant or other removal method so that the filler is removed but surrounding inorganic and/or organic material is undamaged.

Two further embodiments of the present invention provide configurations where the polymer need only be applied as cladding and hence only requires the single, non-precision coating step. Polymer overcoating of silica single-mode rib waveguides is a known method of obtaining enhanced active functionality for silica-based PLC's (see, e.g., Leonard, U.S. Pat. No. 5,553,151, 1996; Bosc et al., U.S. Pat. No. 5,857,039, 1999). In this known approach, since all waveguide cores are comprised of silica, core polymer is not needed and the polymer need only provide optical cladding. The coating can be applied with a simple spin-coater or even sprayed on, and no patterning or extra planarization is needed, providing very simple processing. However, a significant shortcoming of these methods is that the actual enhancement of the active function is rather small, generally no more than about 10% of the improvement available from an all-polymer configuration. The two embodiments of the invention described below will give active performance enhancements in the range of 50% of an all-polymer configuration, and thus have a thermo-optic response approximately 5–10 times greater than the response obtained with the known methods described above.

Figure 9:
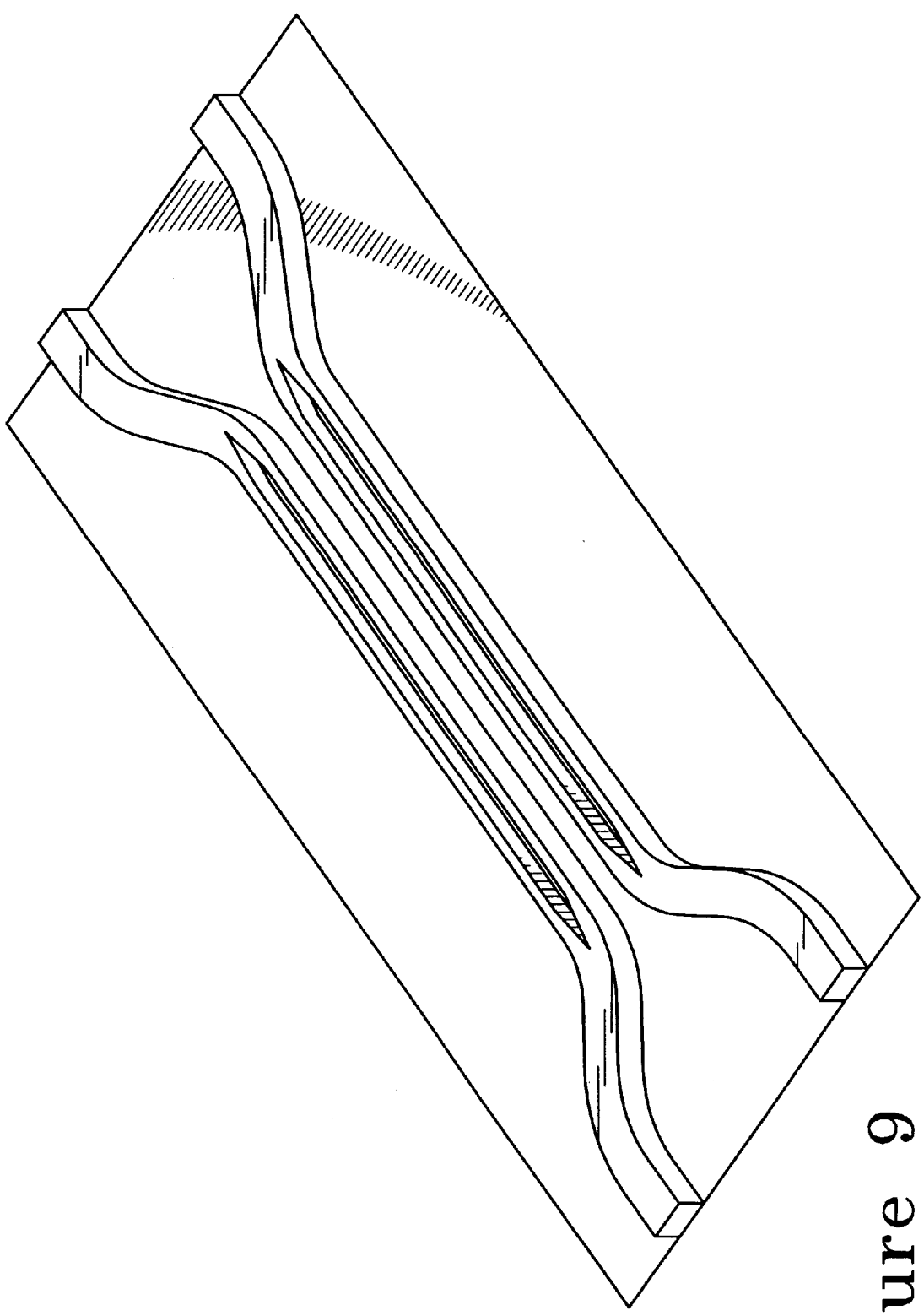
FIG. 9 illustrates a directional coupler with furrowed waveguides.

FIG. 9 illustrates one embodiment of the present invention wherein one or more of the silica waveguide cores in the active area are patterned with furrows partially or completely through the depth of the cores and longitudinally along their centers (i.e. along the optical axis of the waveguide), and the polymer is only applied as a coating material. When cladding polymer is coated over the furrowed waveguides, the resulting waveguide carries the optical mode in a structure having two narrow ridges of silica core laterally surrounding a central channel, that channel being filled with the same polymer that provides the cladding. Note that an equivalent structure could be achieved by building all the regions of the PLC in silica and etching the furrows and coupler gap through the silica top cladding, then refilling those wells with cladding polymer. The basic reason that this configuration gives substantially improved performance is due to the much higher optical field across the furrow than in the external cladding alone. Even though the index of the thermo-optic cladding in the furrow is less than the index of the silica core, a substantial portion of the optical field exists in the furrow. Consequently, the index of the mode is more strongly affected by the index of the cladding polymer than in a configuration having an all-silica core with polymer cladding.

Figure 10:
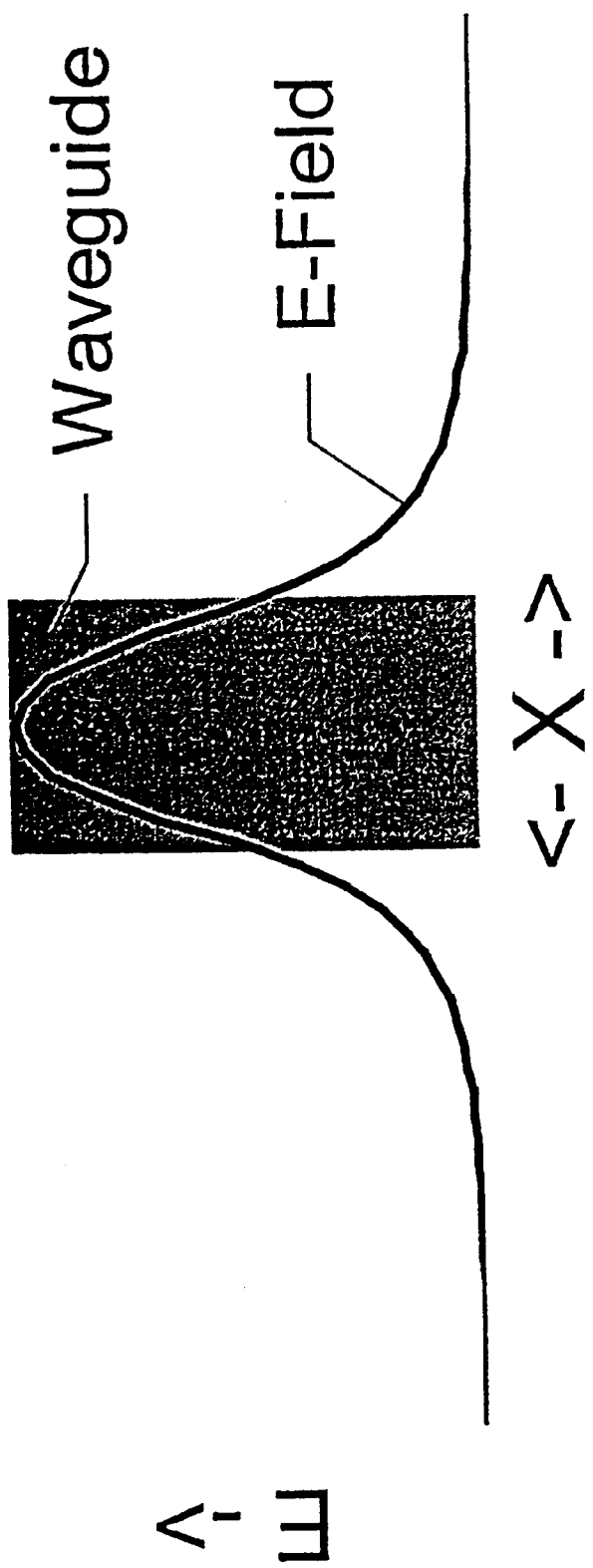
FIG. 10 shows typical E-Field distribution for known configuration of silica rib with polymer overcoat

FIG. 10 shows the typical distribution of optical field in a known single-mode waveguide with polymer cladding over a simple silica rib that has no furrow. Here, electric field is plotted as a function of lateral distance near and across a cross-section of the core waveguide. (Optical intensity would be the square of that field.) For the full two-dimensional field of the waveguide mode, about 80% of the optical energy is in the core and about 20% is in the cladding. Since the bottom cladding is silica, about 85% of the optical energy is in silica and about 15% is in polymer. If the magnitude of the thermo-optic coefficient in the silica is $\frac{1}{10}^{th}$ to $\frac{1}{20}^{th}$ that of the polymer and of opposite sign, as is typical, then the thermo-optic coefficient of a mode in the polymer-clad waveguide is only about 6% to 12% that of the polymer.

Figure 11:
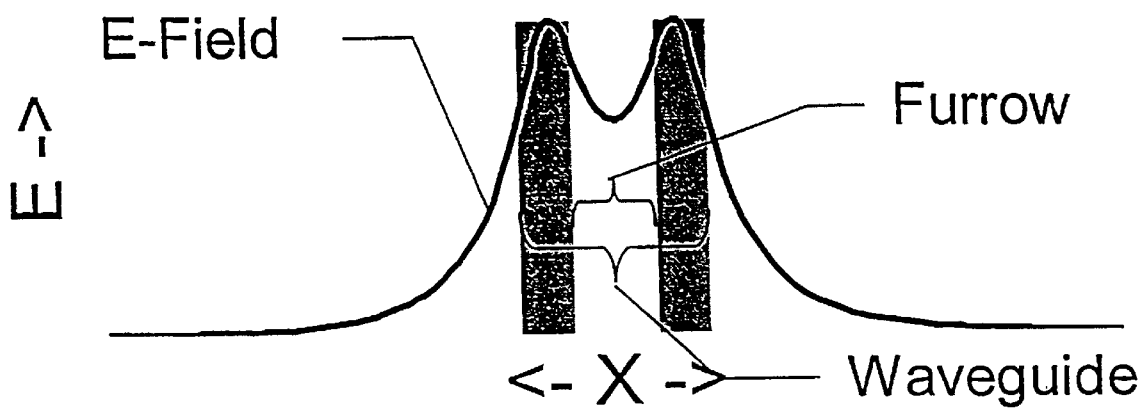
FIG. 11 shows typical E-Field distribution for a furrowed silica waveguide with polymer overcoat

The electric-field plot for a cross section of the furrowed waveguide is shown in FIG. 11. In this case, for about the same level of optical confinement, 50–60% of the optical energy can be in the polymer hence 45–55% of the thermo-optic coefficient of the polymer is available.

The length, width, and depth-of the furrow in the silica core and the change in refractive index of the thermo-optic polymer are selected to provide the desired change in distribution of the optical field in the core. Preferably, the furrow extends through the complete depth and length of waveguide cores in their evanescently-coupled sections. The width of the furrow in a core is generally between about 20% and about 80% of the width of the core, and preferably the furrow is centered in the core and has a width about 50% of the width of the core.

In a further embodiment of the present invention, one or more silica waveguide cores in the active region has short sections fully or partially removed at multiple locations along its length. The removed area plus any other areas where cladding is desired are then coated with a single optical polymer. This produces a segmented path along the waveguide with alternating sections of silica waveguide core and non-guiding polymer. A typically designed segmentation would have several hundred core segments spaced along a few millimeters of the waveguide, each segment being a few microns in length along the optical path and separated from adjacent segments by a few microns. The longer periodicity of the polymer and silica segments (when compared to a Bragg grating) allows the device to utilize Bragg reflection to remove wavelengths outside the wavelength range of the optical signals. An optical signal is guided along this segmented structure with a weak undulation, diverging slightly in the unguided sections of polymer and with a compensating convergence in the silica core segments.

Figures 12, 13:
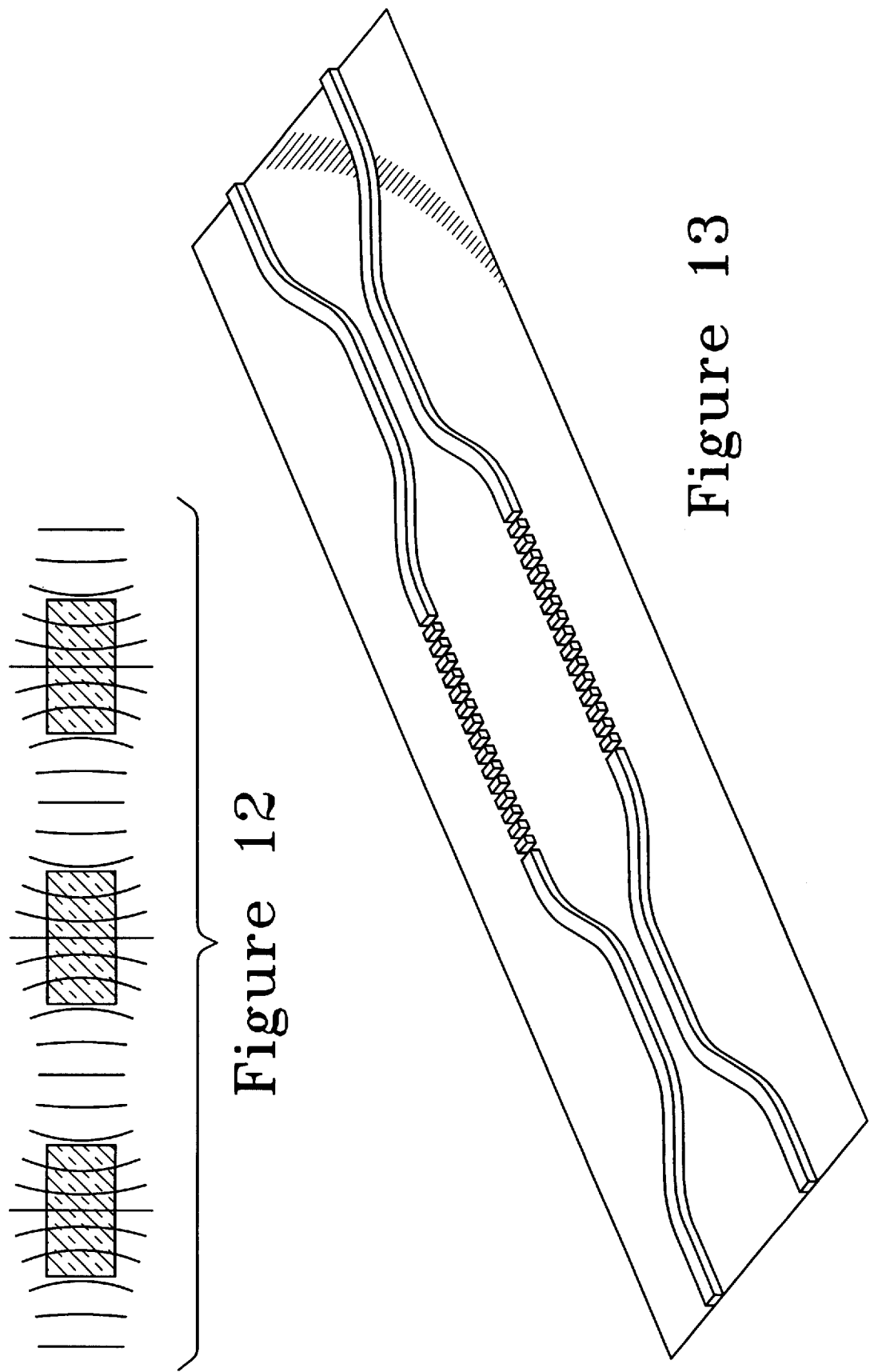
FIG. 12 depicts steady-state wavefront oscillations in a segmented waveguide.
FIG. 13 illustrates an interferometer with segmented waveguides.

The optical phase fronts of this oscillation are depicted (in exaggerated form) in FIG. 12 traversing a few periods of the segmentation. The optical field of a segmented device has a quasi-mode that is guided by the waveguide segments. The optical signal does not have a true guided mode, but the predominant fraction of the optical power propagates along the axis of the device with little loss (typically less than 0.1 dB/cm).

A Mach-Zehnder interferometer with segmentation in each arm, suitable for polymer overcoating is depicted in FIG. 13. Note that in a real device, the number of segments would be in the hundreds or higher. As with the furrowed waveguides, considering the fraction of the mode in the cladding and the segmentation, 50–60% of the optical path for the mode is in polymer and a large fraction of the polymer thermo-optic coefficient is obtained. This allows a device to be configured that has little loss of optical signal but has high response to the applied stimulus (e.g. heat). This embodiment can equally be realized by building the full silica PLC and then etching the segments through the top cladding and core and refilling the resulting wells with polymer.

The length of the silica and polymer segments of a segmented waveguide can be selected such that the variation of the propagation constant with temperature for the quasi-mode is less than the variation of the propagation constant for a guided mode in a waveguide formed of either thermo-optic polymer (or other active material) or silica (or other inorganic optical material). The ratio of the length of the polymer segments to the length of the silica core segments of the waveguide of this invention is selected so that the quasi-mode of an optical signal traveling through the waveguide experiences less variation than does the mode of an all-polymer or all-silica waveguide. The variation can be essentially zero over a fairly wide range of temperatures (typically the variation is on the order of $10^{-6}$ per degree C., less than one-tenth the variation of silica).

Figure 14:
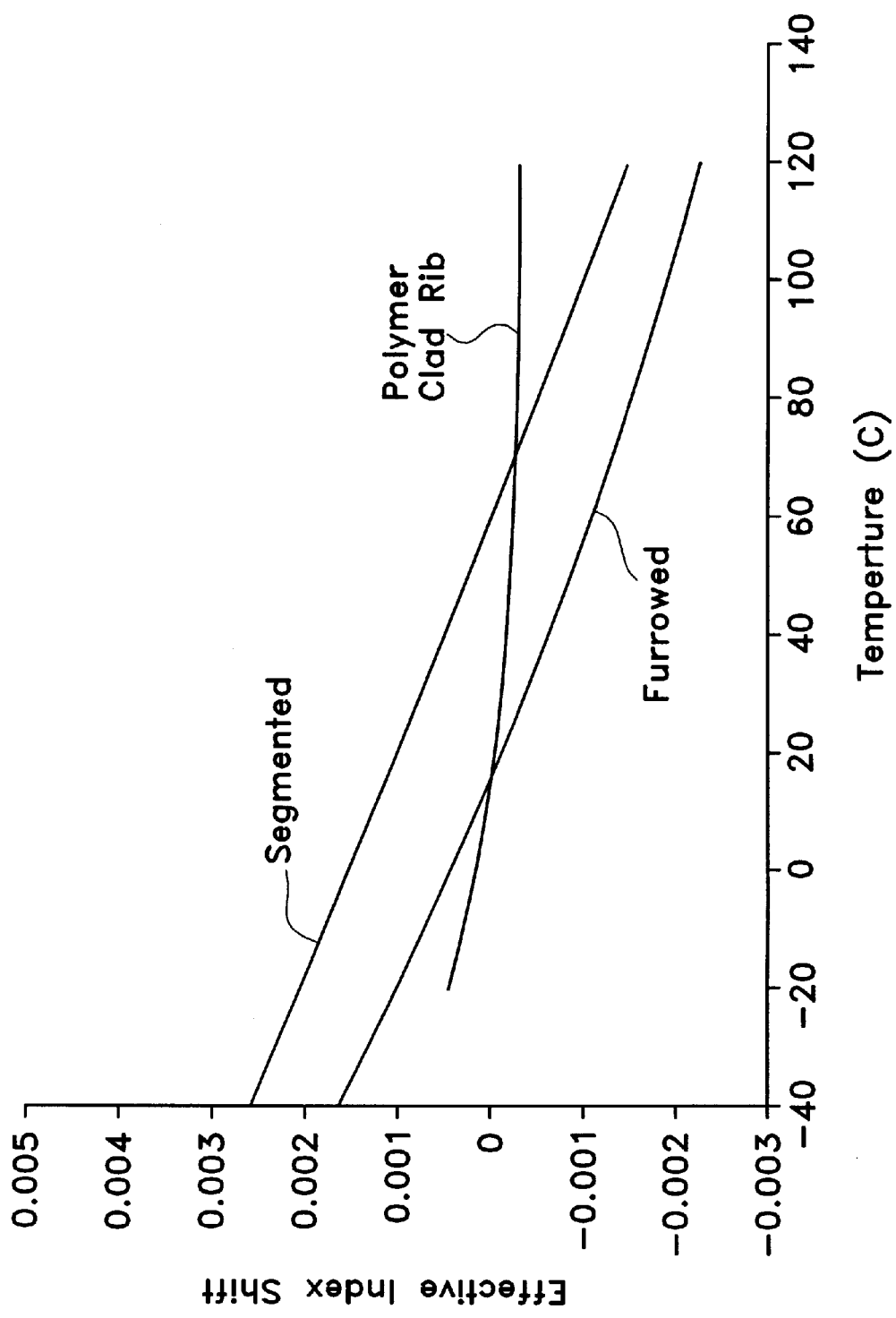
FIG. 14 is a graph of the relative thermal response of polymer-clad silica for channels, furrowed channels, and segments.

FIG. 14 plots from full modal analysis the effective modal index shift with temperature for the three types of waveguide: an existing simple continuous polymer-clad silica rib without the polymer-filled furrow; a polymer-clad furrowed waveguide; and a polymer-clad segmented waveguide. The relatively shallow slope for the existing clad rib shows that much less index change is achieved by changing the temperature for such a configuration as compared to furrowed or segmented waveguides at the same level of confinement (i.e. at cutoff for the first higher-order mode). Since a polymer-clad rib usually starts at a relatively low core-to-clad index difference, it will typically become an ineffective waveguide about 50 degrees C. below ambient, and that is why the plot for the polymer-clad rib doesn't extend below –20 degrees C. A higher index difference may be used to extend the range of temperatures for this structure, but that makes the curve even flatter and reduces the total index change available. As can be seen from FIG. 14, both the furrowed waveguide and the segmented waveguide have pronounced response to change in temperature, whereas the existing simple polymer-clad silica rib has much less response to change in temperature.

FURTHER DESCRIPTION OF THE INVENTION AND THE PREFERRED EMBODIMENTS

It should be clearly appreciated that most of the characteristics of silica being exploited would be applicable to a large variety of other inorganic dielectric waveguide materials including, for example, lithium niobate and other crystalline optical structures suitable for fabricating integrated photonic devices. Consequently, structures fabricated using these optical materials are also within the scope of this invention, although silica is preferred.

Active materials include a thermo-optic polymer that changes refractive index in response to a heat stimulus; an electro-optic polymer that changes refractive index in response to an electric-field stimulus generated by e.g. electrodes; a photo-elastic material that changes refractive index in response to a strain stimulus as applied by e.g. a piezoelectric micrometer driver, solenoid, or hydraulic ram having short throw to induce strain in the material; a piezo-optic material that changes refractive index in response to a strain stimulus; and a photo-refractive material that changes refractive index in response to an optical-field stimulus such as lasers or other devices emitting light of the appropriate wavelength.

The preferred heat source in the thermo-optic structures of the invention is a thin film or electrode heater deposited by e.g. sputtering the appropriate material on or near the thermo-optic polymer. Other heat sources may, of course, be used and include lasers or light-emitting diodes emitting infrared radiation as well as radiative heaters positioned above, on, or near the thermo-optic polymer. The heater may be separate from the integrated photonic device, although preferably the heater is formed as part of the integrated device.

Because it is desirable to lose as little of the optical signal as is possible, a preferred integrated optical device of the invention has the majority of its waveguides formed of inorganic dielectric materials, and the minority of its waveguides comprise one or more active optical materials such as a thermo-optic polymer. The non-active regions of the integrated photonic device are typically fabricated at the same time that much of the structure of the active regions is being fabricated, simplifying the process of constructing the integrated photonic device. Any inorganic cores and/or claddings used in both the active and non-active regions may be formed simultaneously. Thus, for example, where an integrated photonic device contains both a completely passive Mach-Zehnder interferometer formed of silica connected via silica waveguides to a Mach-Zehnder interferometer of the invention as illustrated in FIG. 13, the silica cores of each may be patterned and etched using the same mask and etch step, respectively, and each may be coated by the same thermo-optic polymeric cladding simultaneously by spinning the polymer onto rib cores of each of the MZIs.

The non-active and active regions and devices as described in this application may be configured so that the optical signal is in a single mode or is a multi-mode signal. The active material may be used to replace a portion of a core, a portion of cladding, or both. Active regions typically occupy a small portion of the physical layout of the integrated photonic device of the invention, with much of the integrated photonic device being populated by non-active regions and interconnecting optical pathways such as silica waveguides.

By fabricating active regions on a silica waveguide circuit according to any of the preceding embodiments, active waveguides are created in those regions. These waveguides are active in that they exhibit one or the other, and typically both, of two basic responses when subjected to the intended stimuli, such as locally applied heating. One response is change in the modal-effective index, or "beta" of the waveguide. This results in a change in the total phase an optical signal accumulates when traversing a fixed length of the optical path. This is the response that provides the functionality for interferometer type devices such as the Mach-Zehnder interferometer.

The other response is to induce relative changes in the spatial profiles of the supermodes of multi-moded and coupled waveguides. This produces a change in how the energy of an optical signal coming into the region is distributed among the supermodes and hence where it is directed out of the region. This is the response that provides functionality for devices like the digital optical switches. Since both responses can be provided by this invention, essentially any known waveguide device utilizing refractive changes can be achieved.

Typical applications of this invention to further known waveguide devices are described subsequently. Most of the described devices are suitable for many different configurations of the detailed embodiments and the possible combinations are quite numerous. The following examples are only a small sampling of some of the combinations that may be employed. Although individual devices are described, it should be apparent that the same applications could be made to multi-device circuits and arrays by placing multiple elements within the active regions and/or using multiple active regions on a single substrate.

It should be noted that these optical devices are transparent and reciprocal. This means that they can perform their functions on optical signals propagating from left-to-right as drawn or from right-to-left as drawn. It is however customary to specify the function of the device to operate on signals travelling from left-to-right. The waveguides conveying the signal to the device from the left are referred to as the "input" waveguides, while the waveguides conveying the signal away from the device towards the right are referred to as the "output" waveguides. The following descriptions will conform to this custom, but it should be kept in mind that in actual operation optical signals may be intended to traverse the device in either or both directions.

Mach-Zehnder Switch/Attenuator/Modulator

The Mach-Zehnder waveguide interferometer is the classical active waveguide device. It comes in several forms, all of which operate essentially the same. The incoming signal is split approximately equally between two optical paths. Each half of the signal travels its path and the two are recombined for the device output. The relative phase accumulation between the two paths has a profound effect on how the optical energy is distributed in the modes of the output region when the two signal halves are recombined. By adjusting the phase accumulated along one path relative to the other, the recombined optical signal can be divided between two modes with arbitrarily selectable ratios. If there is one output, it is typically designed to carry away the optical energy in the lowest-order mode and the device is used as a programmable attenuator or modulator, where the light in the higher-order mode is allowed to disperse into unused regions of the PLC. The device can also be configured with two output guides such that the optical power exiting the interferometer will oscillate back and forth between the two output waveguides as the relative phase accumulation is varied.

Figure 1:
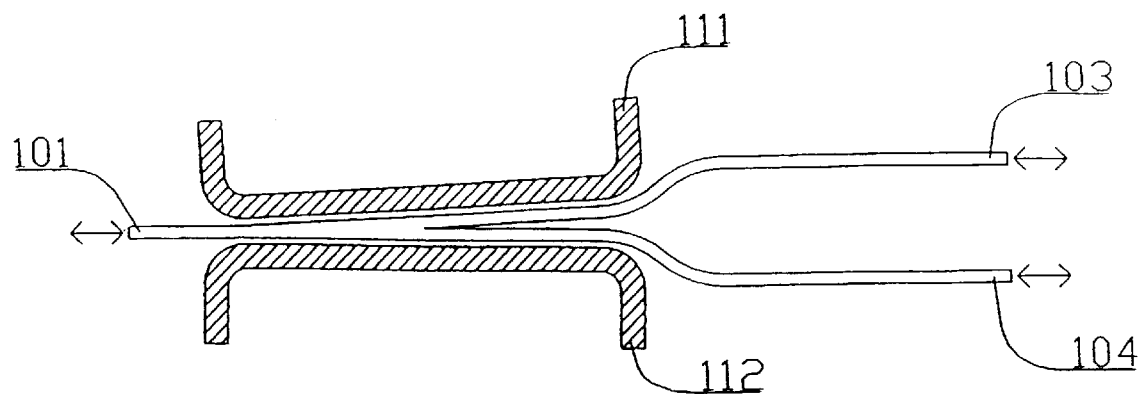
FIG. 1 illustrates an existing digital optical switch configuration based on an adiabatic Y-junction waveguide circuit.
Figure 2:
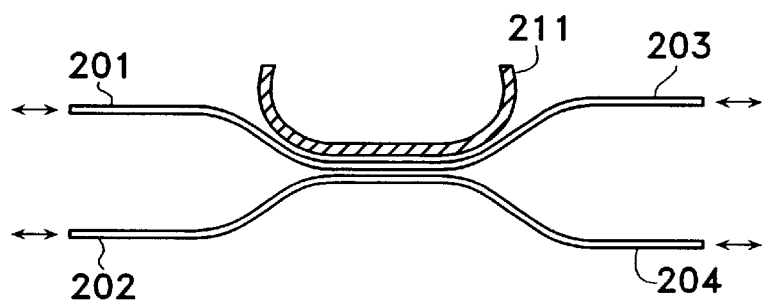
FIG. 2 depicts known digital optical switch configuration based on coupled waveguides with varying gap and width along the coupling region.
Figure 3:
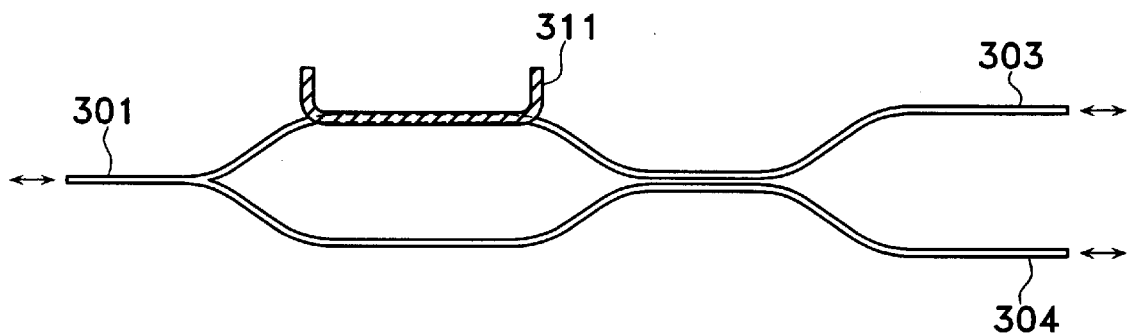
FIG. 3 is a drawing of an existing 1×2-channel Mach-Zehnder interferometer for analog modulation and switching.

FIG. 3 depicts a one-input by two-output Mach-Zehnder interferometer. This provides a switching function for the interferometer. Here the input signal may be switched back-and-forth between the two output guides as well as to intermediate ratios by adjusting the relative phase accumulation in one of the optical paths. It is further possible to use two input waveguides with an appropriate input splitter to switch a superposition of two input signals. This enables for instance a 2×2 optical switching function.

One such Mach-Zehnder interferometer is illustrated in FIG. 13 as described previously. Other configurations include: a Mach-Zehnder interferometer in which one or more of the coupled or uncoupled portions of the waveguides making up the interferometer has a polymer-filled furrow in at least one of the waveguides; a MZI in which a portion of one of the cores is formed of thermo-optic polymer; and a MZI in which a portion of the cladding surrounding a core is formed of thermo-optic polymer.

Directional-Coupler Switch/Attenuator/Modulator

A directional coupler is typically a device where two input waveguides are brought very close together for a certain longitudinal length such that an optical signal travelling along one of the guides strongly couples to the mode that can be supported by the other guide. The two guides then diverge and become the two output guides. When the two waveguides are very well matched in the coupling region, the optical signal will transfer from one guide to the other with high efficiency. This efficiency depends on a delicate balance of the relative beta's of the individual guides and how much the mode of one guide overlaps the spatial distribution of the mode in the other guide. By changing either of these characteristics from the nominal static design point, the coupling can be spoiled, and switching, attenuation, or modulation can be achieved. FIG. 9 shows the general layout of a basic directional coupler of the invention in which the coupled cores are furrowed, filled, and overlaid with thermo-optic cladding.

Instead of furrowed cores, at least one of the coupled cores may be segmented, or at least one of the coupled cores may be formed of thermo-optic polymer. Alternatively or additionally, a portion of the cladding around the coupled cores may be thermo-optic polymer.

Thermally-Induced/Thermally Suppressed Waveguides

A portion of a core in e.g. the uncoupled region of a coupler may also be thermo-optic polymer. Since there is such a large difference in the thermo-optic coefficient between silica and polymer, it is possible to actually drive waveguides into and out-of existence. For instance consider a waveguide having a structure like that depicted in FIG. 7. The polymer core within its silica cladding defines a functional waveguide at e.g. room temperature. If the temperature of that region is raised, the index of the polymer core decreases rapidly and the index of the silica cladding rises slowly. As the indices approach equal values the waveguide becomes ineffective. If the index of the core drops below that of the cladding, it actually enhances the diffraction of the light away from the core.

Figure 4:
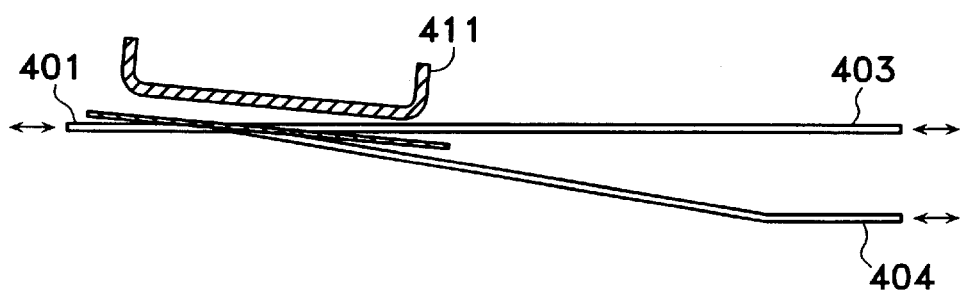
FIG. 4 illustrates a known, basic layout for a TIR waveguide switch.

This mechanism can prove useful for boosting the crosstalk performance of other types of switches. For instance, an existing TIR switch as depicted in FIG. 4 could be configured so the reflector works when the index of the polymer is low (i.e. the polymer is at an elevated temperature), the flanking output waveguide made from polymer cladding and silica core, and the inline-output waveguide made of polymer core and silica cladding.

Figure 15:
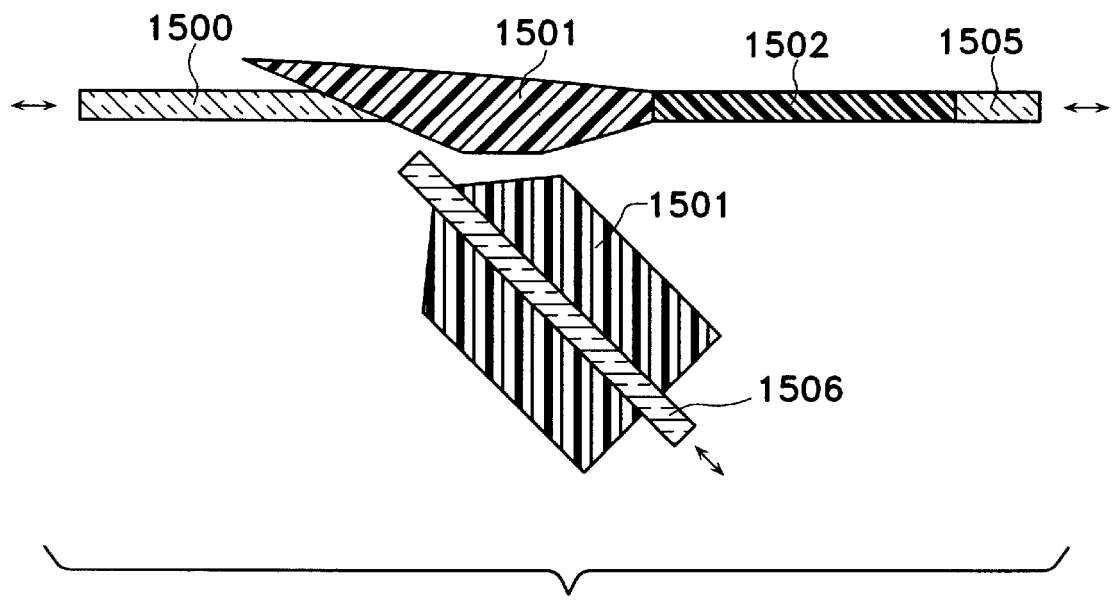
FIG. 15 illustrates a TIR switch enhanced by thermal suppression of waveguide channels.

Such a configuration in accordance with the invention is depicted in FIG. 15. This device comprises an apparent waveguide intersection or junction of two waveguide channels wherein a bar of said active compound is positioned along the intersection or junction, the waveguides being positioned to the bar at about the critical angle to form a switch or modulator utilizing total-internal-reflection of the guided optical signal along the bar. When the temperature is at the lower end of the operating range, the index of the polymer region 1501 is higher and the optical signal passes through the boundary to the polymer channel 1502. The polymer-core waveguide having higher index is a good waveguide and carries the transmitted signal to the output silica waveguide 1505. The flanking output waveguide, having a high-index polymer cladding surrounding the silica core 1506 does not guide the stray light directed towards it and hence exhibits enhanced channel rejection for higher crosstalk performance. When the drive temperature is increased, the index of the polymer decreases and the index of the silica increases slightly. Now the mirror 1501 reflects the optical signal and the flanking output waveguide turns on as the index of the cladding decreases. Meanwhile, the decreasing index of the core in the inline output 1502 causes that waveguide to fade away and the light leaking through the mirror is not carried to the output, improving the crosstalk for that state.

Fabry-Perot Filter

Figure 16:
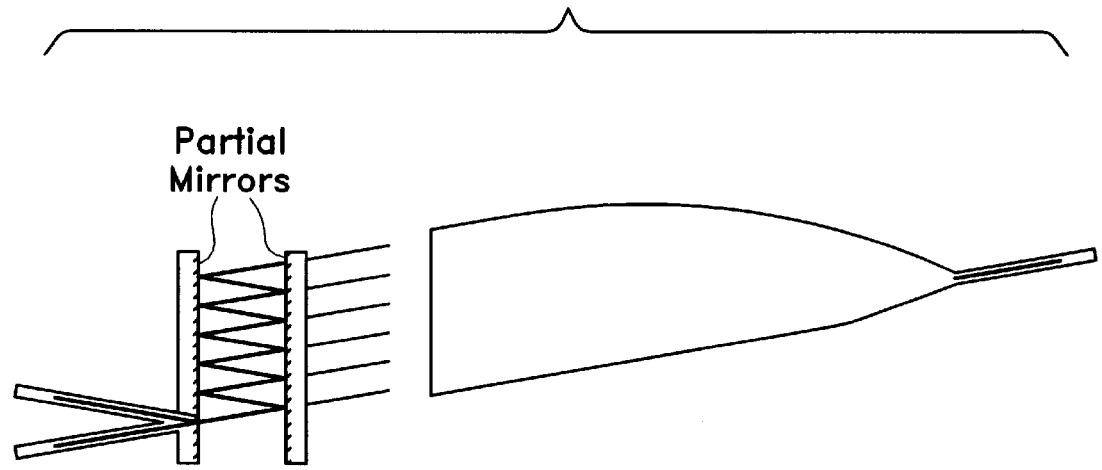
FIG. 16 depicts a Fabry-Perot filter with thermo-optic polymer cavity.

This invention can likewise provide for a wavelength-tunable Fabry-Perot filter as shown in FIG. 16. A silica waveguide is interrupted by a gap with partially-reflecting boundaries. The figure shows the gap at an exaggerated angle to the guide to improve clarity of the drawing. The gap forms an etalon and is filled with thermo-optic polymer. Normally, the two mirrors, and mostly the first mirror, would reflect the majority of the optical signal back towards the input waveguide or a companion at the reflective angle as is depicted. However, certain select wavelengths that accumulate a perfect integer number of waves of phase in a round-trip transition of the Fabry-Perot cavity are resonant with the cavity and can pass through with relative efficiency and are recollected and guided away by the output waveguide. The wavelengths that are resonant with the cavity can be shifted by thermally changing the index of the polymer and hence the round-trip phase accumulation. As with the simple TIR switch, the polymer need not provide core or cladding functionallity for the waveguides and hence can be selected from materials with a broader range of indices.

Athermal Wavelength Filter

As was discussed earlier in this application, because of the fractional divisions of the optical intensity between core and cladding, and because the silica and polymer have opposite signs for their respective thermo-optic coefficients, the thermo-optic response of a polymer-clad silica rib is reduced. If the polymer is positioned just a little farther out from the silica core, for instance by forming a couple-tenths of microns of silica clad around the core before coating with the polymer, the thermo-optic response of the waveguides can be reduced to zero.

Figure 17:
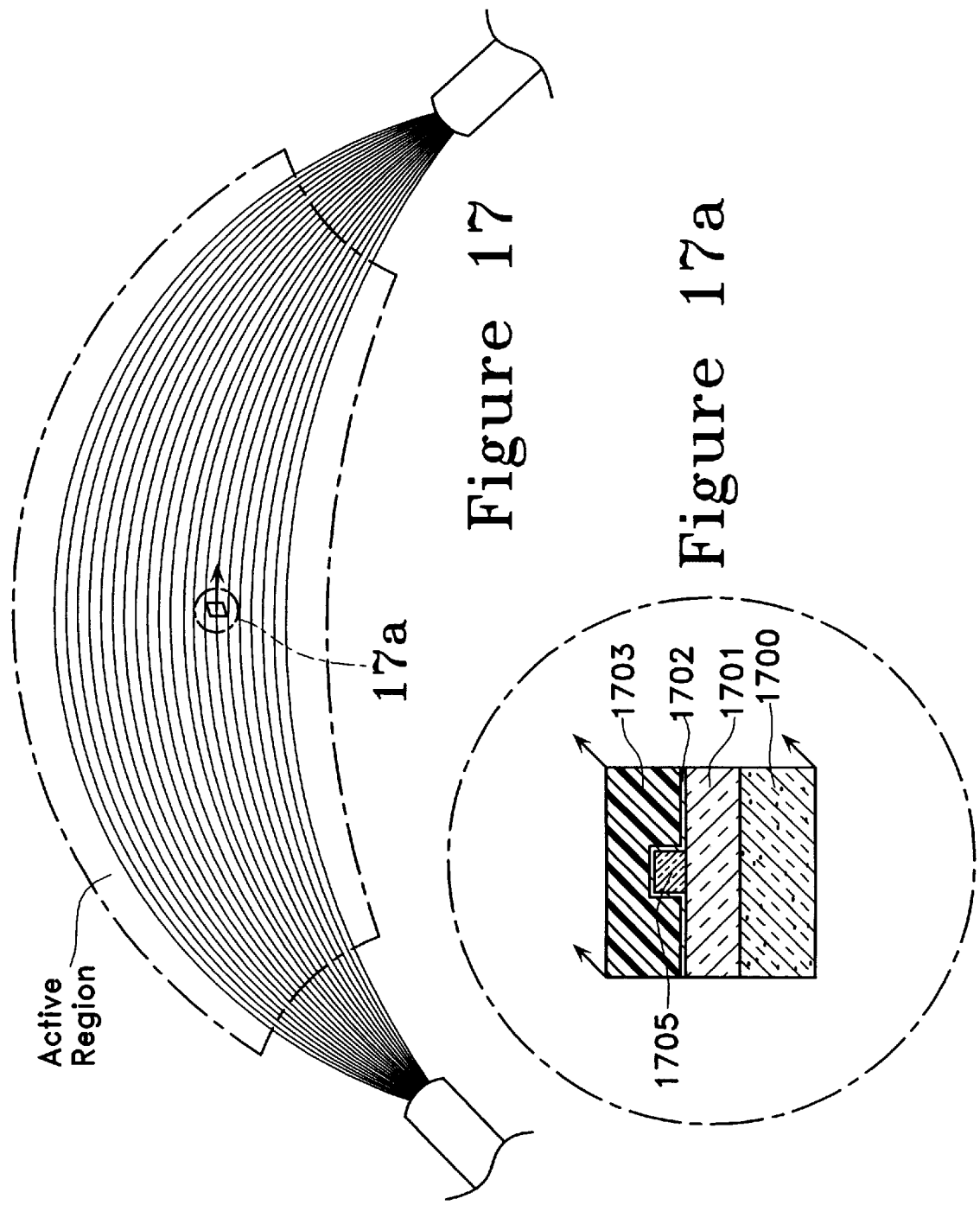
FIG. 17 shows a thermo-optic polymer on a thinly clad rib to reduce thermal drifting, with FIG. 17a showing an enlarged view of a section of FIG. 7.

FIG. 17 sketches such a configuration of the invention. The enlarged view, FIG. 17a, shows a thin skin 1702 of pure silica around the doped-silica core 1705 and the rest of the side and upper cladding comprised of thermo-optic polymer 1703. Here, the thickness of the cladding-like silica skin is selected as a function of the properties of the other materials and dimensions of the silica core. The skin is used to increase the fractional energy of the mode in silica so that the thermal response of the silica for the mode will exactly offset the thermal response of the polymer overcoat for the mode. In typical applications, the proper thickness of the skin will range from zero or a fraction of a micron to about 2 microns. For guides larger than single mode, the required skin thickness may drop to zero, and it may not always be possible to compensate multi-mode guides. The proper skin thickness will provide a waveguide with a vanishingly-small thermal coefficient for the mode index (typically less than about $10^{-6}$ per degree C., less than one tenth of the thermal coefficient for silica). Although this is counter to the needs of active devices, such a configuration can be useful for providing natural thermal stabilization to passive devices that might otherwise require active thermal stabilization.

For instance, an arrayed-waveguide grating (AWG) filter for multiplexing or de-multiplexing dense wavelength-division multiplexed (DWDM) signals must maintain alignment of its filter peaks to the specified wavelengths and this depends on extremely accurate balancing of the optical paths within the grating. Since this balance can be upset by temperature changes, an existing AWG is typically actively stabilized at a specific temperature by heating and in some cases also by cooling the device so there is no significant change in temperature on the device in response to changes in the ambient temperature. Providing a means of making the filter peaks insensitive to temperature can eliminate the need for active temperature control thereby decreasing the operating complexity and increasing the reliability. Known methods of reducing thermal sensitivity of waveguide devices entail disjunction of the waveguides across wedges of thermo-optic polymer. (Kaneko et.al., 1999). This can have the desired effect of reducing the thermal dependence of the filter wavelength, but it imposes penalties on optical loss and crosstalk and increases the difficulty of achieving the targeted wavelengths in the first place.

By using the configuration of this invention in the grating of the AWG, realized by means of the partial-substitution method described in this application, a thermal behavior for the filter can be realized over several tens of degrees C. This configuration is furthermore not only insensitive to natural thermal variations, it can have a predictable response to artificial heat stimulus, where detailed patterns or gradients of heating are applied. Thereby, a fabricated AWG can be actively adjusted to the desired wavelength grid with a small fraction of the thermal power that would be required to thermally stabilize an all-silica AWG, and it can be held to provide the desired wavelength grid during variations of the ambient temperature with the same low thermal power.

Preferably, the thin silica cladding "skin" and the thermo-optic polymer cladding extend the full length of each core of the grating that extends between the two lenses of the AWG. However, it is not necessary for the skin and polymer to extend the full length of each waveguide. Portions may be so coated and their dimensions and change in refractive index selected so that athermal behavior can be achieved for the waveguide.

Figure 18:
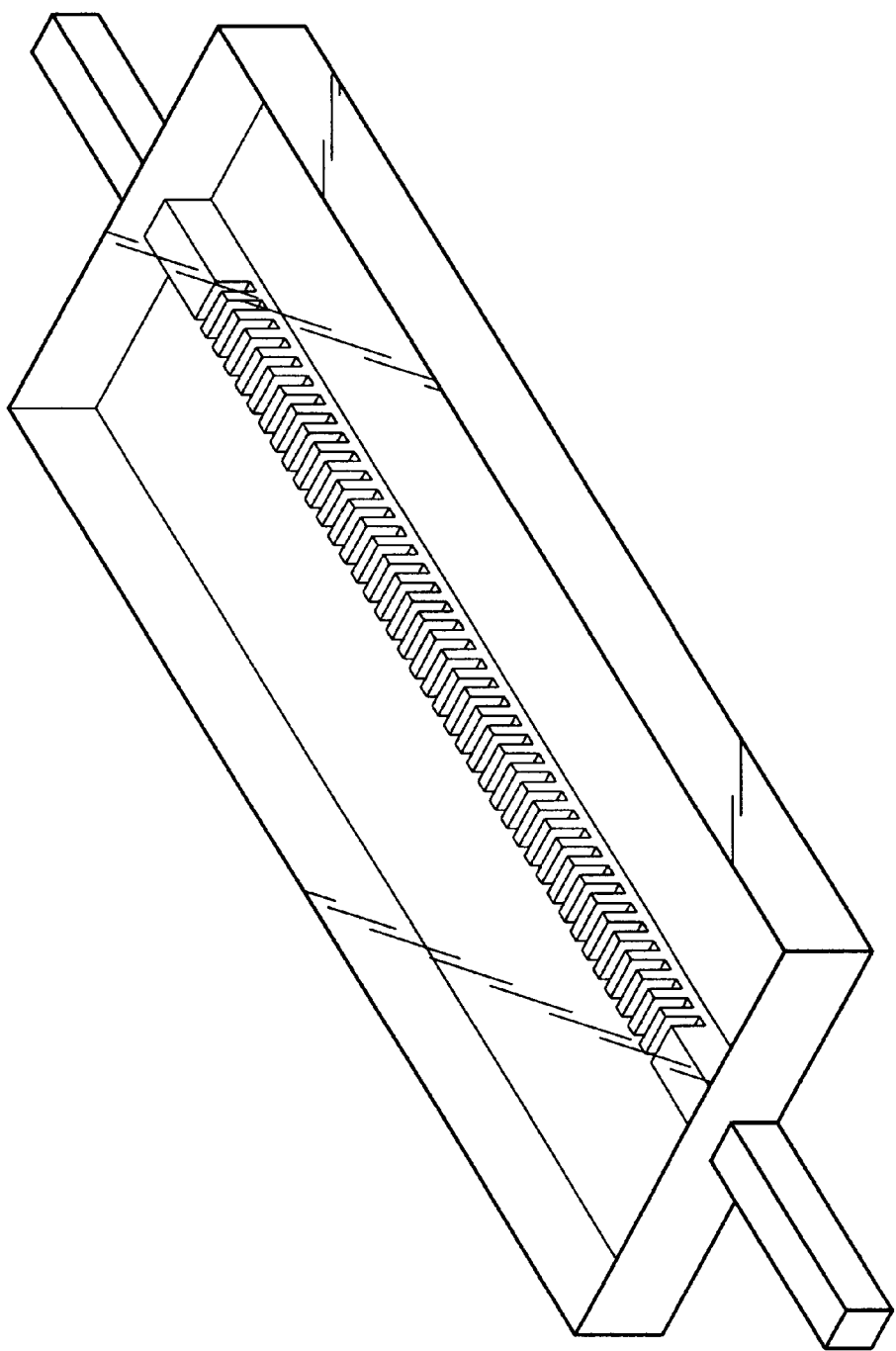
FIG. 18 illustrates a Bragg grating in which thermo-optic polymer cladding extends partially into a silica core and reduces the thermal sensitivity of the Bragg grating.

The same or similar methods could be equivalently employed to reduce the thermal sensitivity of a wavelength filter made with a Bragg-grating waveguide structure. In a Bragg grating waveguide structure, the grating periodicity and the gap between grating elements that is filled with polymer is typically on the order of ¼ to 1 micron, so that the grating reflects a wavelength within the range of wavelengths for the optical signals. To provide an athermal effect, the polymer extends only partially into the silica core as illustrated in FIG. 18. Alternatively, the polymer can extend completely through the silica core section of the waveguide where the length of the silica segments is approximately four times the length of the gap between silica core sections or more.

Otherwise, if a tunable Bragg filter is desired, the size of the elements and their depth and the size of the gap between them can be selected so that the wavelength reflected by the Bragg grating can be selected by heating the Bragg grating a desired amount. The change in refractive index of the polymeric segments between the silica segments effects the change in wavelength that the Bragg grating will reflect.

What is claimed is:

1. An integrated photonic device configured to be suitable for use as an optical component in a fiber-optic communications network that transmits optical signals having optical frequencies, said integrated photonic device comprising a single mechanical substrate supporting multiple coplanar regions of optical thin film assemblies upon the surface of said substrate, wherein:

at least one of said multiple regions is a low-loss region comprising optical core and cladding materials configured to include at least one optical channel waveguide having a core and a cladding, wherein all of said core and cladding materials forming said low-loss region comprise inorganic optical compounds exhibiting low optical loss at the optical frequencies of the optical signals transmitted through the integrated photonic device, such as would be selected from a group of compounds including silica and doped-silica; and at least one other of said multiple regions is an active region comprising optical core and cladding materials configured to form an optical channel waveguide, wherein at least one of said core or cladding materials in said active region comprises at least in part at least one active optical compound that exhibits with respect to the inorganic optical compounds a substantially greater difference either or both in thermal conductivity and in change-of-refractive index in response to a stimulus, such as could be selected from a group of compounds including thermo-optic polymers, furthermore;

said active region being physically adjacent to said low-loss region and said optical waveguide of said active region being optically aligned to the waveguide in said adjacent low-loss region.

2. An integrated photonic device according to claim 1 wherein the optical core of said active region comprises plural short segments of said active optical compound, each of said segments individually interposing through all or part of the waveguide core and/or all or part of the immediately adjacent waveguide cladding.

3. An integrated photonic device according to claim 1 wherein the waveguide of said active region has an optical axis and wherein the optical core of said waveguide of said active region has a trench along the optical axis such that disposed to each side of said trench along the axis there is a narrow rib of low-loss inorganic optical core material and within said trench there is the active optical compound, all configured such that the two ribs of this optical core provide axial guiding of an optical mode that spans said trench under conditions including those that provide the active material with an index-of-refraction lower than the index-of-refraction of the inorganic core material.

4. The integrated photonic device of claim 1 or claim 2 further comprising a source of said stimulus placed sufficiently closely to the active compound that said source of stimulus effects changes in the local distribution of refractive indices for the core and/or cladding materials in the vicinity of said source of stimulus.

5. The integrated photonic device of claim 4 wherein the active compound is thermo-optic and the source of stimulus is an electrically driven source of heat.

6. The integrated photonic device of claim 4 wherein the device comprises an interferometer having at least two arms and wherein at least one of the arms is comprised of at least one of the active regions.

7. The integrated photonic device of claim 4 wherein said device comprises at least two optically-coupled waveguides and a region containing active compound along at least part of the length over which the waveguides are optically coupled.

8. The integrated photonic device of claim 4 wherein said active region contains a digital optical switch made from an adiabatic Y-branch, an adiabatic X-branch, or a parabolic coupler and utilizing index gradients across the vicinity of the branching regions to enable switching functionality, said index gradients typically being about $10^{-4}$ per micron or greater.

9. The integrated photonic device of claim 4 wherein said device comprises an apparent waveguide intersection or junction of two waveguide channels wherein a bar of said active compound is positioned along the intersection or junction, the waveguides being positioned to the bar at about the critical angle to form a switch or modulator utilizing total-internal-reflection of the guided optical signal along the bar.

10. The integrated photonic device of claim 1 wherein within at least one active region, the channel waveguide core is either the low-loss inorganic compound or the active compound and at least one of the adjacent claddings is the other of the low-loss inorganic compound and the active compound, and furthermore wherein the refractive index of the active compound is such that it is equal to the refractive index of the inorganic low-loss compound in response to the stimulus, such that when said index-equality is established the channel loses the ability to perform optical waveguiding.

11. The integrated photonic device of claim 1 or claim 2 wherein said device comprises at least one optical element having an optical path wherein said at least one active region is positioned in or along the optical path of said optical element and is configured to either enhance or suppress the response of the device to the stimulus and said device is selected from the group consisting of:
- a modulator;
- a variable optical attenuator;
- an M×N optical switch wherein M and N individually and independently have integer values greater than or equal to one;
- an arrayed-waveguide grating in which at least one said active region is placed along the waveguide array;
- a grating-based filter; and
- a Fabry-Perot filter having a resonator cavity in which the active compound is positioned within the resonator cavity, wherein the active compound is selected from the group consisting of:
- a thermo-optic polymer that changes refractive index in response to a heat stimulus;
- an electro-optic polymer that changes refractive index in response to an electric-field stimulus;
- a photo-elastic material that changes refractive index in response to a strain stimulus;
- a piezo-optic material that changes refractive index in response to a strain stimulus; and
- a photo-refractive material that changes refractive index in response to an optical-field stimulus.

12. The integrated photonic device of claim 3 wherein the two ribs and the active optical compound within said trench of said waveguide are configured with a geometry such that an optical signal of said optical signals traveling along said axis through said waveguide has only one guided optical mode for one or both of the transverse-electric and transverse-magnetic optical polarizations.

13. The integrated photonic device of claim 2 providing for a quasi-mode of the optical field, wherein said active segments individually have a first length and the portions of the core between adjacent active segments have a second length, and wherein the ratio of said first length to said second length is such that the thermal variation of propagation constant for said quasi-mode is substantially less in magnitude than for an optical signal solely in said active material or solely in said inorganic optical compounds, and said variation is essentially zero at a selected nominal operating temperature.

14. The integrated photonic device of claim 1 wherein the waveguide core is comprised of silica, said core has an overcoat of silica cladding having a thickness selected from a range from zero to about three microns, said silica cladding having a coating of active material having a thermo-optic coefficient of index substantially higher than that of said silica cladding such that the thermal variation of propagation constant for the primary mode of said waveguide is substantially less in magnitude than that of said silica cladding, and said variation being essentially zero at a selected nominal operating temperature.

15. A method of making an integrated photonic device, said method comprising the acts of:
   a) forming a plurality of inorganic waveguides on a single substrate using inorganic dielectric materials having low loss; and
   b) forming at least one active waveguide on said substrate wherein at least a portion of said device is formed of an active material having higher loss;
   c) wherein the majority of the waveguides formed on said substrate comprise said inorganic dielectric materials.

16. The method of claim 15 wherein said inorganic waveguides and said at least one active waveguide are optically interconnected so that an optical signal traveling through said active waveguide also travels through said passive waveguide.

17. The method of claim 16 wherein said inorganic waveguides and said at least one active waveguide are configured on said substrate to form at least one optical device having an active region.

18. The method of claim 16 wherein said inorganic waveguides and said at least one active waveguide are configured on said substrate to form and optically interconnect at least one optical device having an active region and at least one passive optical device having no active region.

19. The method of claim 18 wherein said active region is formed by placing a temporary filler in a region on said substrate where said active region is to be formed, and subsequently removing said temporary filler to create a void and filling said void with said active material.

20. The method of claim 15 wherein the act of forming at least one active waveguide on said substrate comprises removing at least a portion of at least one of said inorganic waveguides and replacing said portion with at least one active material to form said active waveguide.

* * * * *